(12) United States Patent
Crawley et al.

(10) Patent No.: US 9,185,834 B2
(45) Date of Patent: Nov. 10, 2015

(54) ISOLATED ETHERNET PHYSICAL LAYER (PHY)

(75) Inventors: Philip John Crawley, Sacramento, CA (US); Sajol Ghoshal, El Dorado Hills, CA (US); John R. Camagna, El Dorado Hills, CA (US)

(73) Assignee: AKROS SILICON, INC., San Jose, CA (US)

( * ) Notice: Subject to any disclaimer, the term of this patent is extended or adjusted under 35 U.S.C. 154(b) by 1089 days.

(21) Appl. No.: 11/739,547

(22) Filed: Apr. 24, 2007

(65) Prior Publication Data

US 2008/0267212 A1    Oct. 30, 2008

(51) Int. Cl.
*H02H 9/00* (2006.01)
*H05K 9/00* (2006.01)

(52) U.S. Cl.
CPC ................................ *H05K 9/0066* (2013.01)

(58) Field of Classification Search
USPC ............................................. 361/119
See application file for complete search history.

(56) References Cited

U.S. PATENT DOCUMENTS 6,881,096 B2 *   4/2005   Brown et al. ............ 439/620.01
7,706,112 B2 *   4/2010   Crawley et al. ................. 361/56

* cited by examiner

*Primary Examiner* — Stephen W Jackson

(57) ABSTRACT

A network device comprises an Ethernet physical layer (PHY) comprising an isolation, protection, and electromagnetic interference suppression barrier operative for isolated power and data transfer.

59 Claims, 20 Drawing Sheets

ISOLATED ETHERNET PHYSICAL LAYER (PHY)

BACKGROUND

Various communications, medical, computing, industrial, and other systems implement isolation barriers to electrically isolate sections of electronic circuitry. An isolator is a device that can transfer a signal between sections of electronic circuitry while maintaining electrical isolation between the sections.

A typical conventional design attains isolation, for example, by connecting to a communication channel through a transformer. The transformer provides isolation both for surge and galvanic isolation. Power can be transmitted on the line through the transformer.

SUMMARY

According to an embodiment of a network system, an Ethernet physical layer (PHY) comprises an isolation, protection, and electromagnetic interference suppression barrier operative for isolated power and data transfer.

BRIEF DESCRIPTION OF THE DRAWINGS

Embodiments of the invention relating to both structure and method of operation may best be understood by referring to the following description and accompanying drawings.

DETAILED DESCRIPTION

A digitally isolated Ethernet physical layer (PHY) enables isolated power and data transfer across an isolation barrier.

Figure 1A:
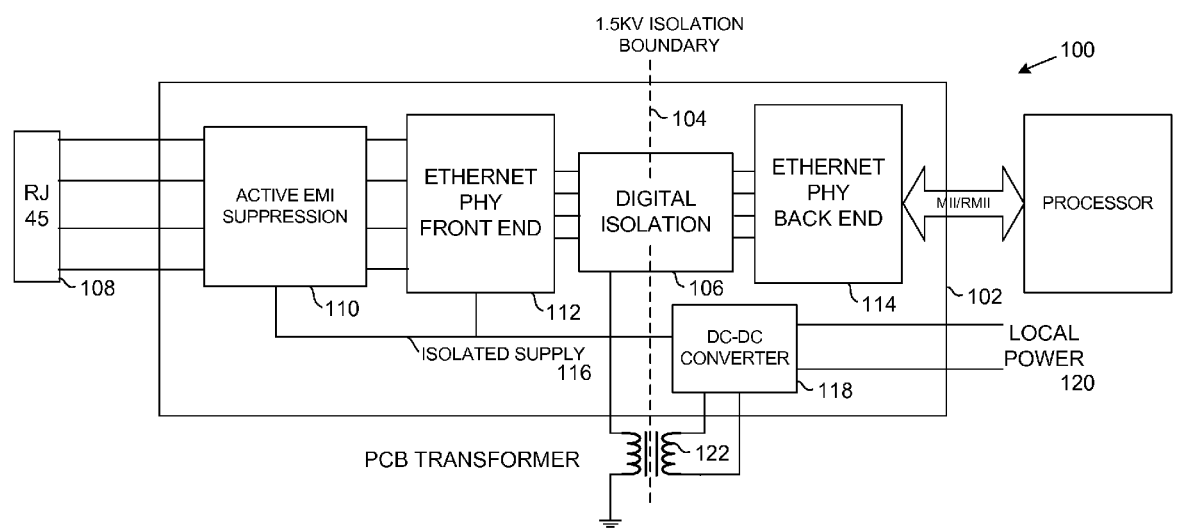
FIGS. 1A, 1B, 1C, and 1D are schematic block and circuit diagrams depicting embodiments of a network device with an isolated Ethernet physical layer (PHY) in respective generic, non-Power-over-Ethernet (non-PoE), Power-over-Ethernet (PoE), and digitally isolated PHY with an MII/SMII interface configurations.

Referring to FIG. 1A, a schematic block diagram depicts an embodiment of a network device 100 with an isolated Ethernet physical layer (PHY) 102. The Ethernet PHY 102 comprises an isolation, protection, and electromagnetic interference suppression barrier 104 that is configured to enable isolated power and data transfer.

An isolator 106 coupled internal to the Ethernet PHY 102 can be configured so that the Ethernet PHY 102 can be directly connected to a network line 108, without an intervening transformer or other isolation. The Ethernet PHY 102 can further include surge and electromagnetic interference (EMI) protection 110. The isolator 106 can incorporate digital isolation. Other embodiments may use analog components to supply isolation, or may include aspects of analog processing of digital signals to implement isolation. For example, the Ethernet PHY 102 can include an isolator 106 that is internal to the Ethernet PHY 102 and is operative to transmit a signal through the internal isolation and protection barrier 104 by converting a digital signal to a fast differential edge modulation that tracks process characteristics across the isolation barrier 104, passing the fast differential edge modulation through the isolation barrier 104. In various embodiments, the Ethernet PHY 102 can be implemented as a 10 gigabit PHY, a gigabit PHY, a 100 megabit PHY, and/or a 10 megabit PHY that differentiates the passed fast differential edge modulation to form a pulse according to a transfer function that amplifies the pulse.

The illustrative isolated Ethernet PHY 102 includes an Ethernet PHY front end 112 and an Ethernet PHY back end 114 that are isolated via the digital isolator 106. Active EMI protection 110 and the Ethernet PHY front end 112 are powered by an isolated supply 116. A Direct Current (DC)-DC converter 118 on the backend side of the isolation barrier 104 supplies local power 120.

The Ethernet PHY 102 can be configured to transfer power via an external transformer 122.

In accordance with another embodiment of a network device 100, a digitally-activated Ethernet physical layer (PHY) 102 can be configured for isolated power and data transfer and direct connection to a network line 108 with surge and electromagnetic interference (EMI) protection 110. A power transformer 122 can be coupled to and external from the Ethernet PHY 102.

In various arrangements, the Ethernet PHY 102 can be implemented as a non-Power-over-Ethernet (non-PoE) device or a Power-over-Ethernet (PoE) device.

Figure 1B:
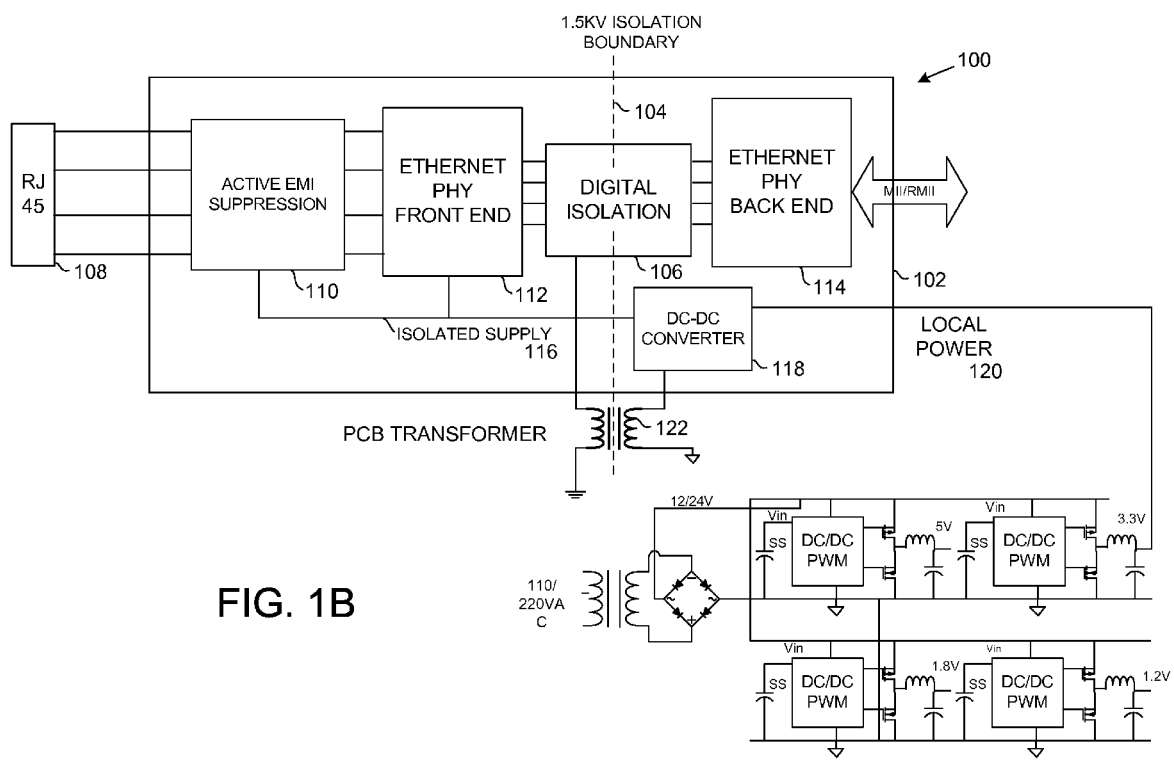
Figure 12A:
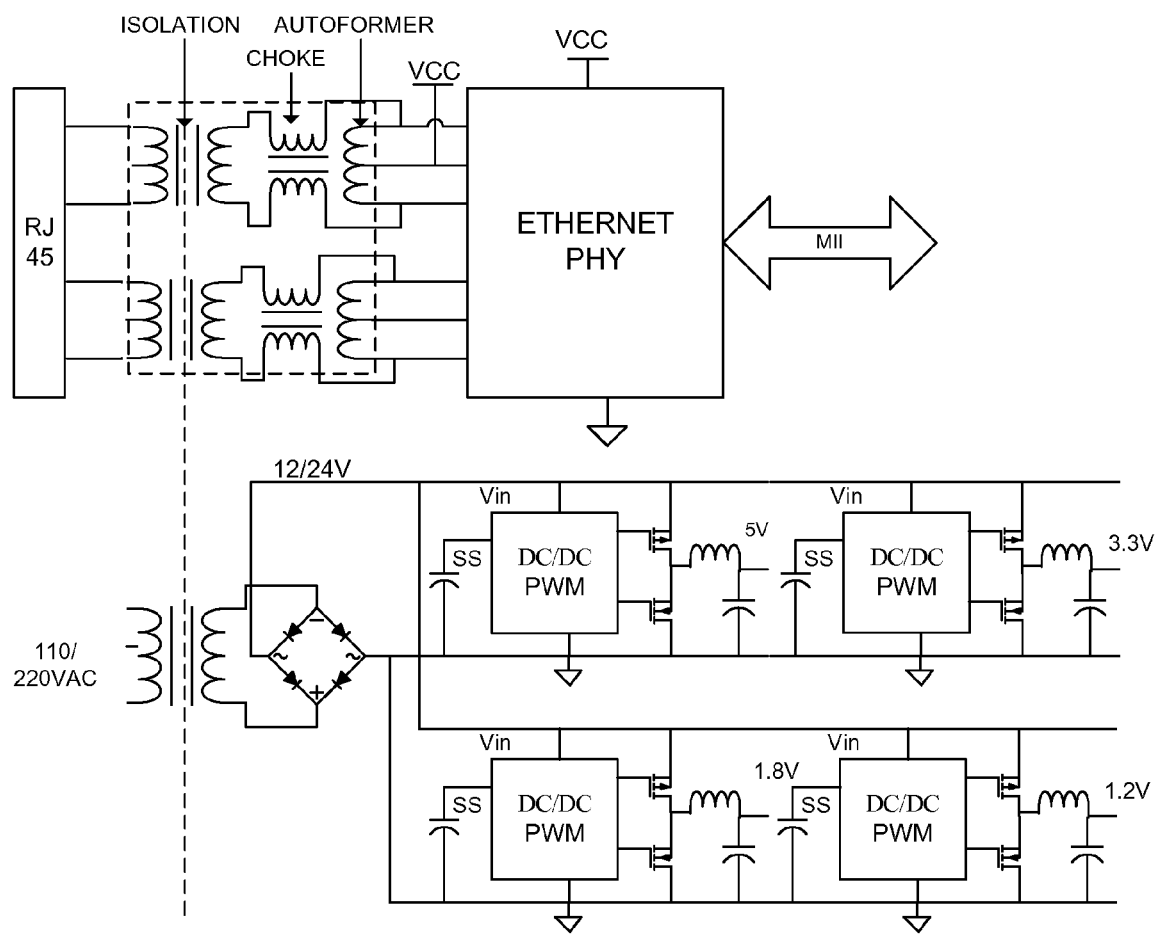
FIGS. 12A and 12B are schematic block and circuit diagrams showing conventional Ethernet PHYs which do not have internal isolation in respective non-PoE and PoE arrangements.

Referring to FIG. 1B, in a non-Power-over-Ethernet (non-PoE) application with the isolated Ethernet PHY 102 coupled directly to a network line 108 and the DC-DC converter 118 supplying local power to a device. The isolated Ethernet PHY 102 in a non-PoE architecture has internal isolation and sources local power to a device, thus differing from a conventional PHY, shown in FIG. 12A, which is isolated from a network line via isolation such as a transformer, choke, and autotransformer.

Figure 1C:
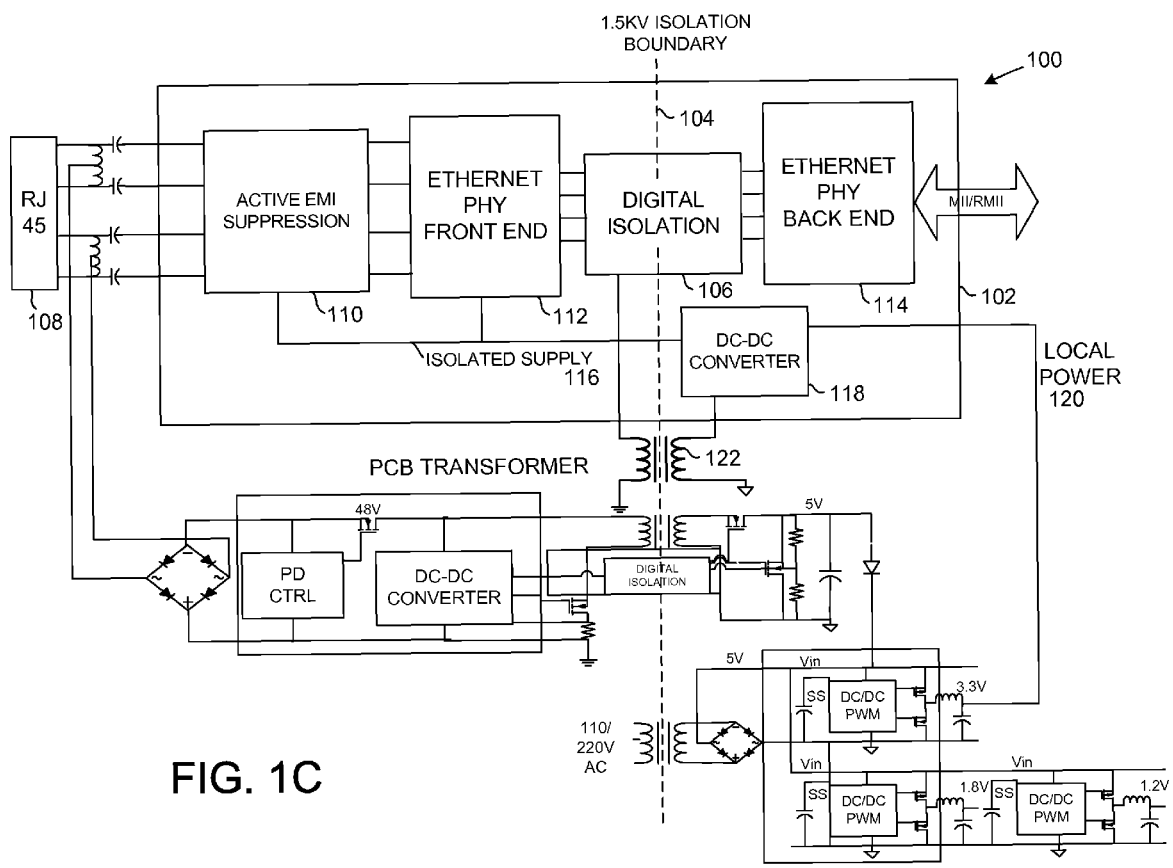

Referring to FIG. 1C, a schematic block and circuit diagram illustrates an embodiment of an Ethernet PHY 102 in the form of a Power-over-Ethernet (PoE) device 100. For a Power-over-Ethernet (PoE) device, the Ethernet PHY 102 can be constructed as a power sourcing equipment (PSE) controller or a powered device (PD) controller. The illustrative embodiment depicts a powered device (PD) arrangement wherein the Ethernet PHY 102 is coupled to a powered device (PD) controller 166 and DC-DC converter 168 at a connection to the line 108.

In accordance with another embodiment, a network device 100 can comprise an Ethernet PHY 102 which is directly connectable to a network line 108 and comprises an internal isolation, protection, and electromagnetic interference suppression barrier 104 that is operative for isolated power and data transfer.

Figure 12B:
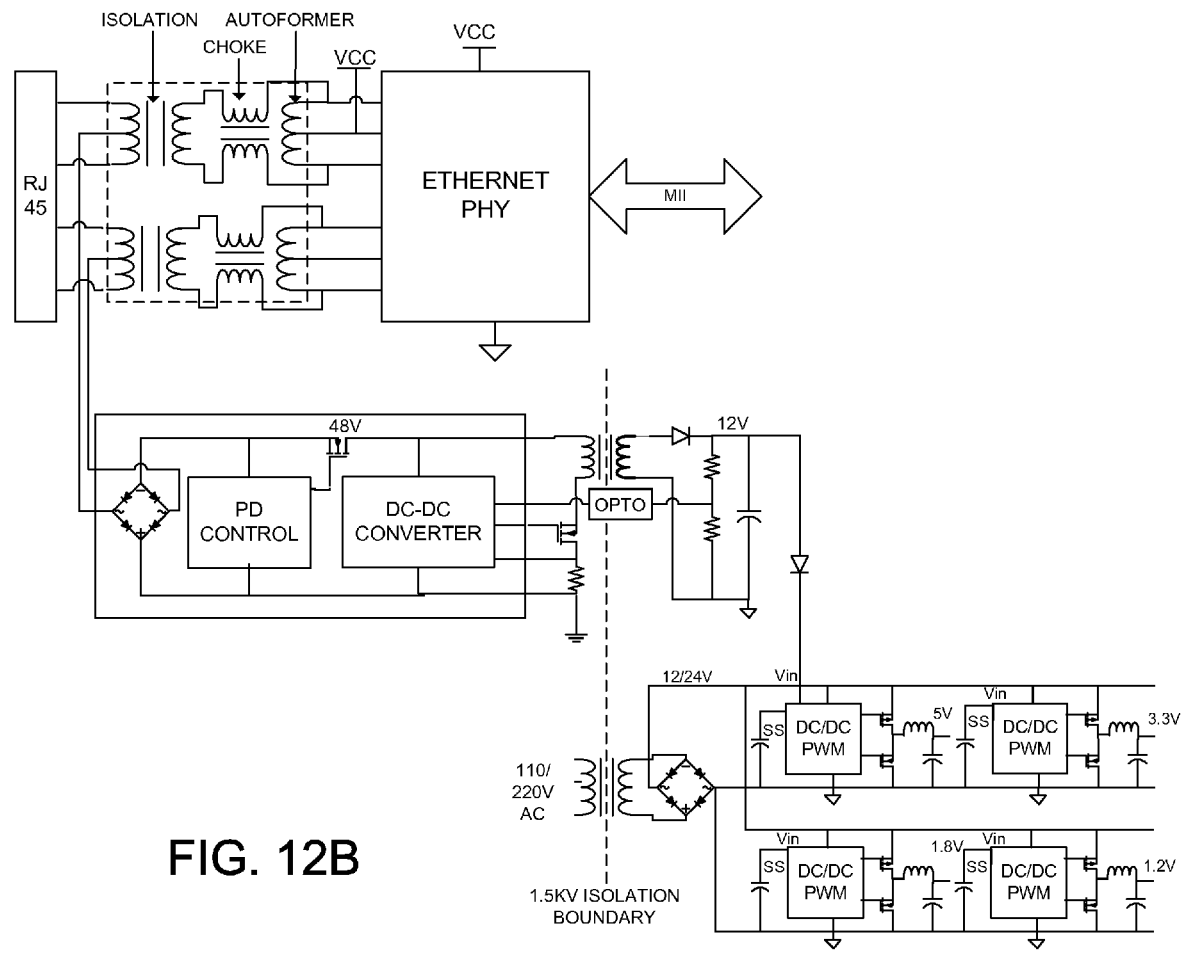

The isolated Ethernet PHY 102 in a PoE architecture has internal isolation and sources local power to a device, thus differing from a conventional PHY in a PoE configuration, shown in FIG. 12B, which is isolated from a network line via isolation such as a transformer, choke, and autotransformer.

Figure 1D:
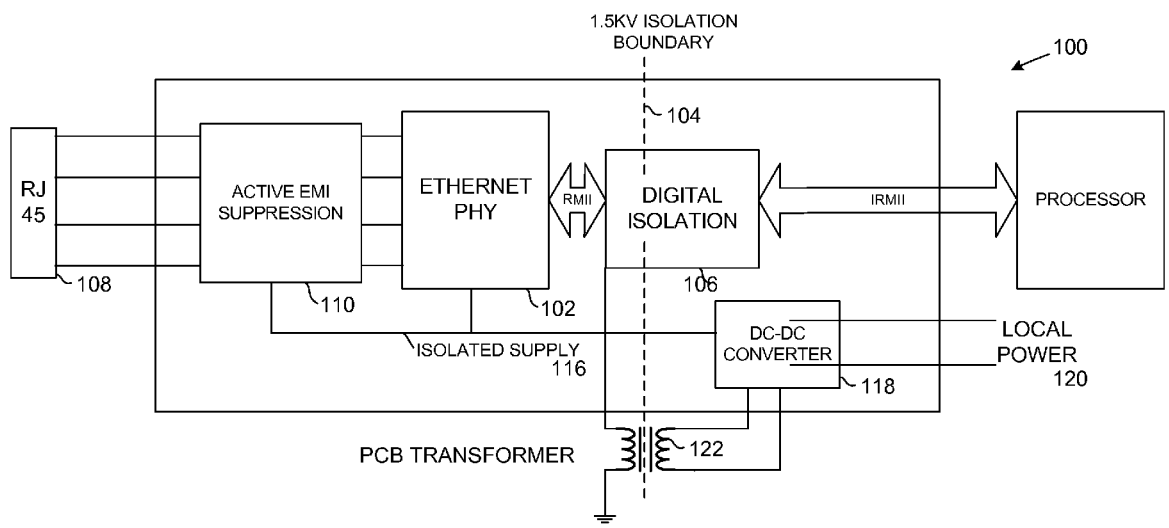

FIG. 1D illustrates an embodiment of a digitally-isolated PHY 102 with a media independent interface/reduced media independent interface (MII/RMII) interface.

Figure 2A:
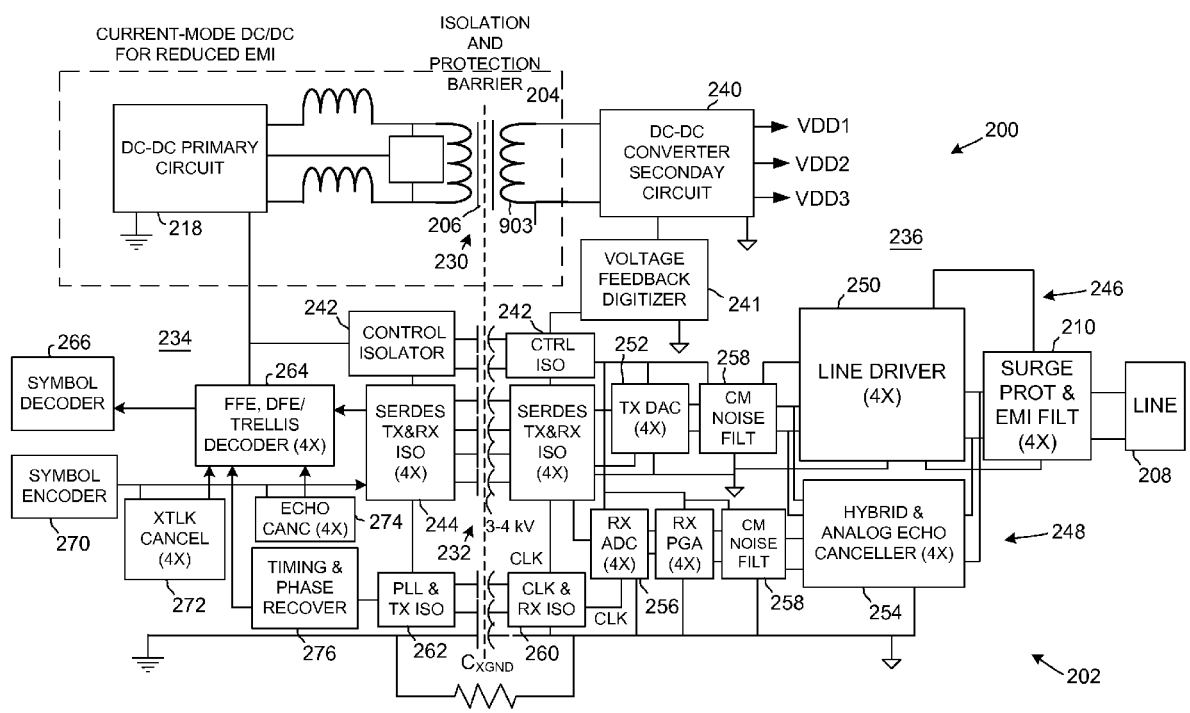
FIGS. 2A and 2B are schematic block and circuit diagrams showing embodiments of network devices including an isolated Ethernet physical layer (PHY) with examples of components and devices that can be implemented in the Ethernet PHY.
Figure 2B:
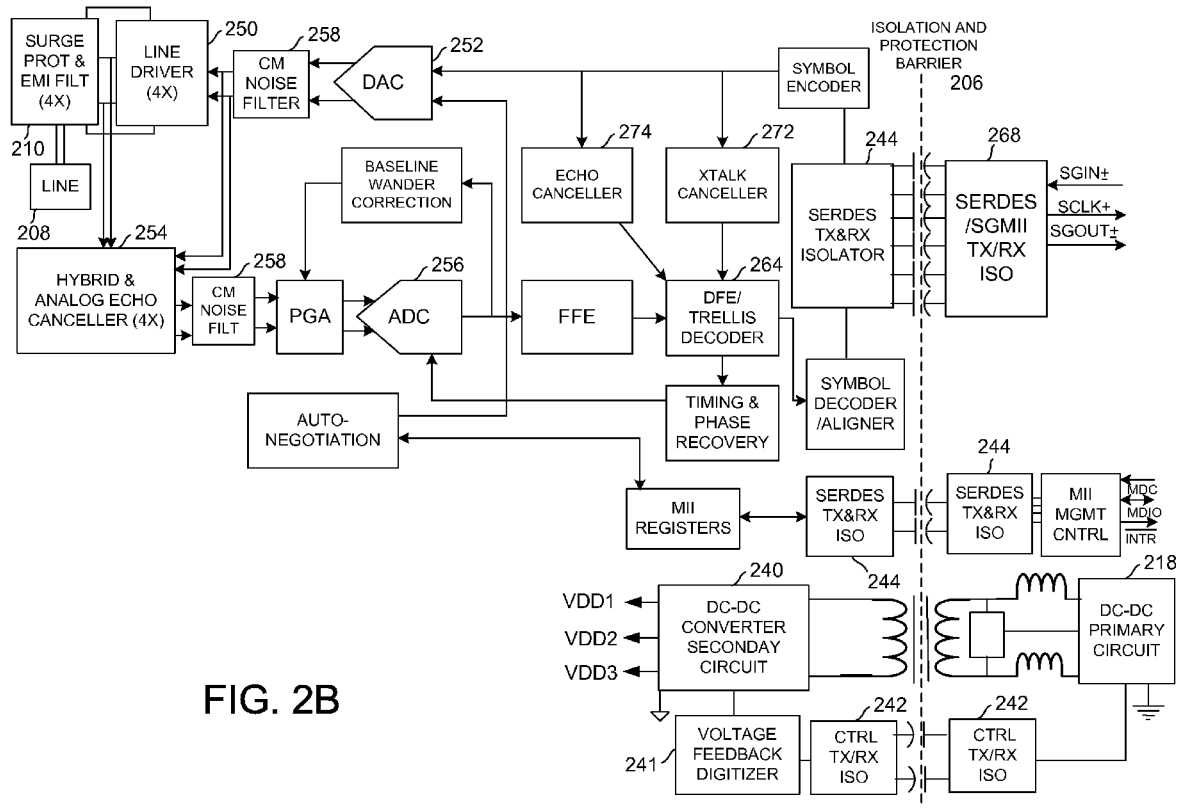

Referring to FIGS. 2A and 2B, schematic block and circuit diagrams showing embodiments of network devices including an isolated Ethernet physical layer (PHY) with examples of components and devices that can be implemented in the Ethernet PHY. Multiple functional blocks are depicted in combination in FIGS. 2A and 2B. In various embodiments and implementations, functional blocks can be selected or omitted according to application. For example, the isolated Ethernet PHY 202 can be implemented for Power-over-Ethernet (PoE) or non-PoE applications, and for PoE applications as power sourcing equipment (PSE) or a powered device (PD). Different concepts can also be implemented according to power considerations such as the amount of power to run particular devices, components, and/or systems, operating and communication speed, loading, and the like.

In FIG. 2A, a schematic block and circuit diagram shows an embodiment of a network device 200 including an isolated Ethernet physical layer (PHY) 202 with examples of components and devices that can be implemented in the Ethernet PHY 202. In the illustrative embodiment, the Ethernet PHY 202 further comprises an isolation and protection barrier 204 including a power transformer isolation barrier 230 and a capacitive isolation barrier 232. First 234 and second 236 circuits coupled across the capacitive isolation barrier 232 and the power transformer isolation barrier 230 and are configured to transfer power across the power transformer isolation barrier 230 and communicate data across the capacitive isolation barrier 232 including power feedback data that controls power transfer across the power transformer isolation barrier 230.

The first 234 and second 236 circuits are referenced to separate grounds, for example an earth ground and isolated or device ground.

The isolated Ethernet PHY 202 also includes primary 218 and secondary 240 DC-DC converters that transfer power across the power transformer isolation barrier 230 and a voltage feedback digitizer 241 coupled to the secondary DC-DC converter 240 that is configured to generate a voltage feedback signal. Control isolators 242 are included operative to communicate the voltage feedback signal across the capacitive isolation barrier to the primary DC-DC converter 218.

The capacitive isolation barrier 232 is internal to the Ethernet PHY 202. Receiver and transmitter control isolators 242 are also internal to the Ethernet PHY 202 and coupled across the capacitive isolation barrier 232.

In some implementations, the Ethernet PHY 202 can be formed to include receiver and transmitter serializer/deserializer (SERDES) isolators 244 operative to communicate data across the capacitive isolation barrier 232. A transmitter channel 246 and a receiver channel 248 couple the receiver and transmitter SERDES isolators 244 directly to the line 208 without intervening transformers or other isolation. The transmitter channel 246 comprises an active termination, electromagnetic interference (EMI), voltage mode line driver 250 which is coupled directly to the line 208, and a transmitter digital to analog converter (DAC) 252 coupled between the line driver 250 and the transmitter SERDES isolator 244. The receiver channel 248 comprises a hybrid and analog echo canceller 254 coupled directly to the line 208, and a receiver analog to digital converter (ADC) 256 coupled between the line driver 250 and the transmitter SERDES isolator 244.

In some implementations, the line driver 250 can be implemented as an active termination line driver that is internal to the Ethernet PHY 202 and coupled directly to the line 208 rather than through a transformer or other isolation devices. In other examples, the line driver 250 can be an active termination, electromagnetic interference (EMI) filtering, voltage mode line driver. In still other examples, the line driver 250 can have one or more selected aspects of functionalities including active termination, non-active termination, electromagnetic interference (EMI) filtering, voltage mode, current mode, or the like.

A common mode noise filter 258 can be coupled between the active termination, electromagnetic interference (EMI), voltage mode line driver 250 and the transmitter digital to analog converter (DAC) 252 in the transmitter channel 246. Also, a common mode noise filter 258 can be coupled between the hybrid and analog echo canceller 254 and the receiver analog to digital converter (ADC) 256 in the receiver channel 248.

The control isolators 242 not only pass control information across the isolation barrier 204 including digitized voltage feedback for the DC-DC converter 218 but also passes control information to control functional blocks in the transmitter channel 246 and the receiver channel 248. For example, the control isolators 242 pass control information to the transmitter DAC 252, the receiver ADC 256, the common mode noise filters 258, and other blocks. The transmitter 246 and receiver 248 channels interface directly to the line 208 so that switching noise, digital noise, or noise from any activity passes through the common mode noise filters 258 to eliminate direct coupling between the line 208 and the communication channels.

The transmitter channel 246 and the receiver channel 248 form a communication loop that passes across the isolation barrier 204. For an eight-line arrangement, the isolation barrier 204 can be connected to four ADCs 256 and four DACs 252 for the four channels. The isolation barrier 204 thus includes four sets of isolators that pass both ADC and DAC data. The amount of DAC data is typically less than the ADC data amount so that the DAC 252 can be used as a control channel. Accordingly, in some embodiments, the controls isolators 242 can be omitted with control functionality replaced by the DACs 252 in the communication channel.

For the capacitive isolation barrier 232 which is internal to the Ethernet PHY 202, the receiver and transmitter serializer/ deserializer (SERDES) isolators 244 are coupled across the capacitive isolation barrier 232 and operative to communicate data across the capacitive isolation barrier 232.

The Ethernet PHY 202 further comprises a surge protection and electromagnetic interference (EMI) suppression filter 210 coupling the receiver channel 246 and the transmitter channel 248 directly to the line 208.

In addition to channels for transferring power and communicating signals, a separate isolated controller channel via the control isolators 242 can be implemented. Additionally, in some embodiments a clock channel can be used to pass a clock or timing signal.

The Ethernet PHY 202 can further comprise a clock receiver isolator 260 and a phase-locked loop (PLL) and transmitter isolator 262 which are internal to the Ethernet PHY 202 and coupled across the capacitive isolation barrier 232 for transferring clock signals across the capacitive isolation barrier 232.

The clock receiver isolator 260 and phase-locked loop (PLL) transmitter isolator 262 can operate in combination for clock recovery functionality. The clock receiver isolator 260 and PLL and transmitter isolator 262 form a clock recovery loop that crosses the isolation barrier 204 that performs clock recovery including timing and phase recovery.

In various embodiments, the Ethernet PHY 202 can be a 10 gigabit PHY, a gigabit PHY, a 100 megabit PHY, a 10 megabit PHY, or any suitable configuration. The Ethernet PHY 202 can be a transformerless PHY or implemented with a transformer.

In various embodiments, isolation barriers internal to the Ethernet PHY 202 can be capacitive isolation barriers, electrostatic isolation barriers, transformer isolation barriers, isolation barriers formed by serializer/deserializers (SERDES), magnetic isolation barriers, optical isolation barriers, thermal isolation barriers, resistive isolation barriers, piezoelectric isolation barriers, or other suitable isolation barriers according to application characteristics.

Channels across respective isolation barriers internal to the Ethernet PHY 202 can be power transfer channels, control channels, communication channels including receive communication channels or transmit communication channels, clock channels, and the like.

The illustrative isolated Ethernet PHY 202 is depicted in the configuration of a non-Power-over-Ethernet (non-PoE) device 200. In other embodiments and implementations, an Ethernet PHY can be a Power-over-Ethernet (PoE) device.

In an illustrative embodiment of a non-PoE network device 200, an Ethernet PHY 202 with internal isolation comprises an isolation and protection barrier 204 which is operative for isolated power and signal transfer, a primary Direct Current (DC)-DC converter 218 and a secondary DC-DC converter 240 that transfer power across a transformer channel 230 of the isolation and protection barrier 204, and a feedback digitizer 241 coupled to the secondary DC-DC converter 240 that generates a feedback signal based on the transferred power. Primary and secondary control isolators 242 communicate the feedback signal across a capacitive channel 232 of the isolation and protection barrier 204 to control power transfer across the transformer channel 230.

A power transformer 222 is external from the Ethernet PHY 202 is coupled to the PHY 202.

Isolation internal to the Ethernet PHY 202 can comprise primary and secondary communication isolators 244 that communicate data across a capacitive channel 232 of the isolation and protection barrier 204. Isolation internal to the Ethernet PHY 202 can further comprise primary 260 and secondary 262 clock isolators that communicate clock signals across a capacitive channel 232 of the isolation and protection barrier 204.

In some embodiments, internal isolation within the Ethernet PHY 202 can further comprise a communication channel across the capacitive isolation channel 232 of the isolation and protection barrier 204. For example, the communication channel can include one or more active termination, electromagnetic interference (EMI) filtering, voltage mode line drivers 250 internal to the Ethernet PHY 202 which are coupled directly to the line 208. In various embodiments, the communication channel can be implemented with one or more line drivers 250 with functionality selected from active termination, non-active termination, electromagnetic interference (EMI) filtering, voltage mode, and current mode.

The communication channel across the capacitive isolation channel 232 of the isolation and protection barrier 204 can further include one or more surge protection and electromagnetic interference (EMI) filters 210 coupled directly to the line 208.

In some embodiments, the Ethernet PHY 202 can be formed with a communication channel across the capacitive isolation channel 232 of the isolation and protection barrier 204 which comprises a transmitter channel 246 and a receiver channel 248 coupling the receiver and transmitter serializer/deserializer (SERDES) isolators 244 directly to the line 208. The transmitter channel 246 can comprise an active termination, electromagnetic interference (EMI), voltage mode line driver 250 coupled directly to the line, and a transmitter digital to analog converter (DAC) 252 coupled between the line driver 250 and the transmitter SERDES isolator 244. The receiver channel 248 can comprise a hybrid and analog echo canceller 254 coupled directly to the line 208 and a receiver analog to digital converter (DAC) 252 coupled between the line driver 250 and the transmitter SERDES isolator 244.

The communication channel continues on the non-line side of the isolation barrier with a trellis decoder 264, symbol decoder 266, symbol encoder 270, cross-talk canceller 272, and echo canceller 274.

The communication channel across a capacitive isolation channel 232 of the isolation and protection barrier 204 can comprise the receiver and transmitter serializer/deserializer (SERDES) isolators 244 which are internal to the Ethernet PHY 202 and coupled across the capacitive isolation channel 232 and operative to communicate data across the capacitive isolation barrier 204.

The communication channel across the capacitive isolation channel 232 of the isolation and protection barrier 204 can also comprise a clock and receiver isolator 260 and a phase-locked loop (PLL) and transmitter isolator 262 internal to the Ethernet PHY 202 and coupled across the capacitive isolation channel 232 which operates to transfer clock signals across the capacitive isolation barrier 204. A timing and phase recovery block 276 is communicatively coupled to the PLL and transmitter isolator 262 and the clock channel to supply recovered clock signals to the trellis decoder 264.

Referring to FIG. 2B, a schematic block and circuit diagram illustrates another embodiment of a network device 200 including an isolated Ethernet PHY 202. The communication channel across the capacitive isolation channel 232 of the isolation and protection barrier 204 can comprise a capacitive isolation barrier internal to the Ethernet PHY 202. A receiver and transmitter serializer/deserializer (SERDES) isolator 244 which is internal to the Ethernet PHY can be coupled to the secondary side of the capacitive isolation channel 232. A receiver and transmitter SERDES and Serial Gigabit Media Independent Interface (SGMII) isolator 268 which is also internal to the Ethernet PHY 202 is coupled to a primary side of the capacitive isolation channel 232 and operative to communicate data across the capacitive isolation barrier.

Figure 3:
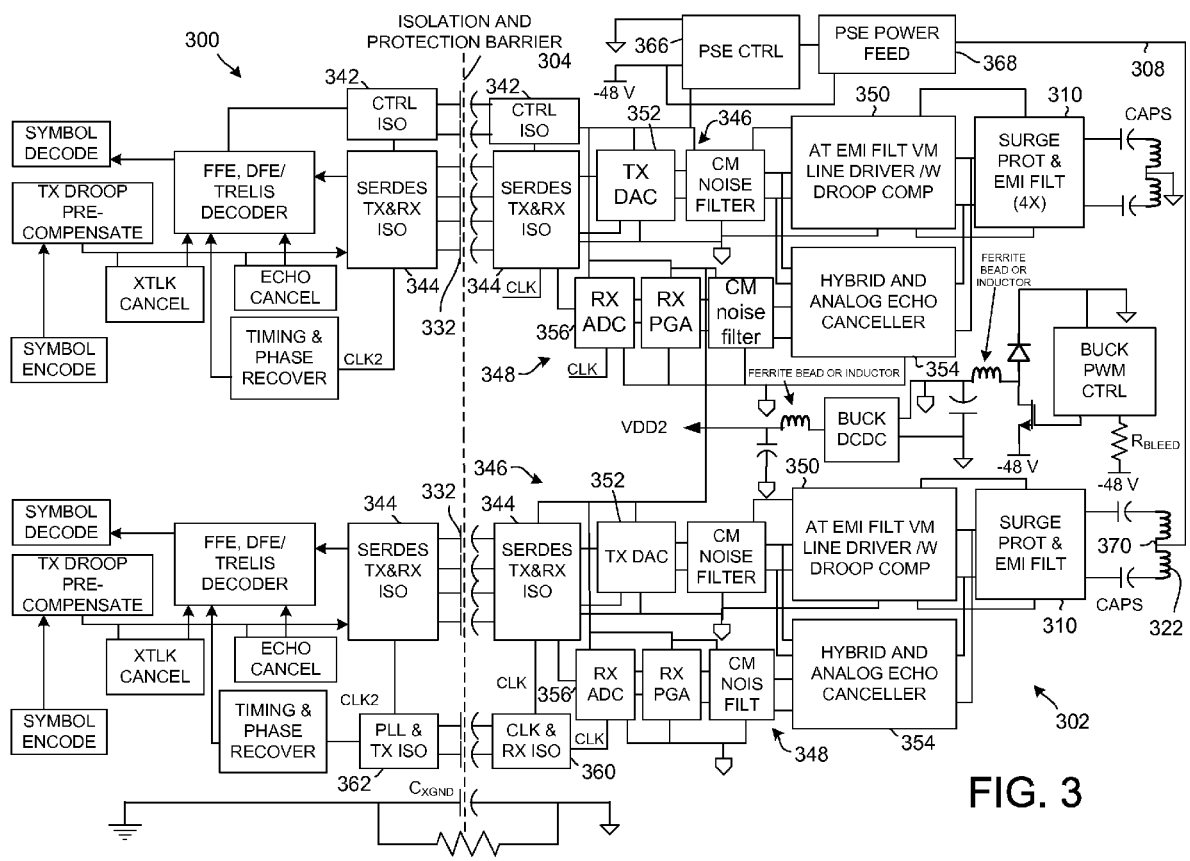
FIG. 3 is a schematic block and circuit diagram illustrating an embodiment of an isolated Ethernet PHY configured as a PoE device comprising a power sourcing equipment (PSE) controller.

For example, referring to FIG. 3, a schematic block and circuit diagram illustrates an embodiment of an isolated Ethernet PHY 302 configured as a PoE device 300 comprising a power sourcing equipment (PSE) controller 366 and a PSE power feed 368 that is operative to source power for to powered device (PD).

The illustrative network device 300 comprises a Power-over-Ethernet (PoE) Power Sourcing Equipment (PSE) Ethernet physical layer (PHY) 302 with internal isolation. The Ethernet PHY 302 comprises an isolation and protection barrier 304 which is operative for isolated power and signal transfer, a PSE controller 366, and a PSE feed 368 which is coupled to and controlled by the PSE controller 366. An autotransformer 370 is operative to feed sourced power to an application. Control isolators 342 are coupled across a capacitive channel 332 of the isolation and protection barrier 304 and communicate data across the capacitive channel 332 including a feedback signal to control power transfer across a transformer 322.

In some embodiments, the autotransformer 370 can be replaced or implemented by one or more pairs of discrete inductors.

Internal isolation within the Ethernet PHY 302 comprises communication isolators 344 that communicate data across a capacitive channel 332 of the isolation and protection barrier 304.

The Ethernet PHY internal isolation can also include clock isolators 360 and 362 that communicate clock signals across a capacitive channel 332 of the isolation and protection barrier 304.

Internal Ethernet PHY isolation can further be implemented with a communication channel across a capacitive isolation channel 332 of the isolation and protection barrier 304. For example, the communication channel can comprise one or more active termination, electromagnetic interference (EMI) filtering, voltage mode, droop compensation line drivers 350 internal to the Ethernet PHY 302 and coupled directly to the line 308 without an intervening transformer or other isolation device.

In various embodiments, the line drivers 350 can have functionality selected from one or more of active termination, non-active termination, electromagnetic interference (EMI) filtering, non-EMI filtering, voltage mode, current mode, droop compensation, and non-droop compensation functionality.

The Ethernet PHY 302 with internal isolation can be implemented with a communication channel across the capacitive isolation channel 332 of the isolation and protection barrier 304 further including one or more surge protection and electromagnetic interference (EMI) filters 310 coupled directly to the line 308.

In the illustrative embodiment, the communication channel across the capacitive isolation channel 332 for the Ethernet PHY 302 can further comprise a transmitter channel 346 and a receiver channel 348 coupling receiver and transmitter serializer/deserializer (SERDES) isolators 344 directly to the line 308. The transmitter channel 346 comprises an active termination, electromagnetic interference (EMI), voltage mode line driver 350 coupled directly to the line 308 and a transmitter digital to analog converter (DAC) 352 coupled between the line driver 350 and the transmitter SERDES isolator 344. The receiver channel 348 comprises a hybrid and analog echo canceller 354 coupled directly to the line 308 and a receiver analog to digital converter (ADC) 356 coupled between the line driver 350 and the transmitter SERDES isolator 344.

The receiver and transmitter serializer/deserializer (SERDES) isolators 344 can be formed internal to the Ethernet PHY 302 and coupled across the capacitive isolation channel 332 and operate to communicate data across the capacitive isolation barrier 304.

In some embodiments, a communication channel across the capacitive isolation channel 332 of the isolation and protection barrier 304 can also comprise a clock receiver isolator 360 and a phase-locked loop (PLL) transmitter isolator 362 internal to the Ethernet PHY 302 which are coupled across the capacitive isolation channel 332 and function to transfer clock signals across the capacitive isolation barrier 304.

Figure 4A:
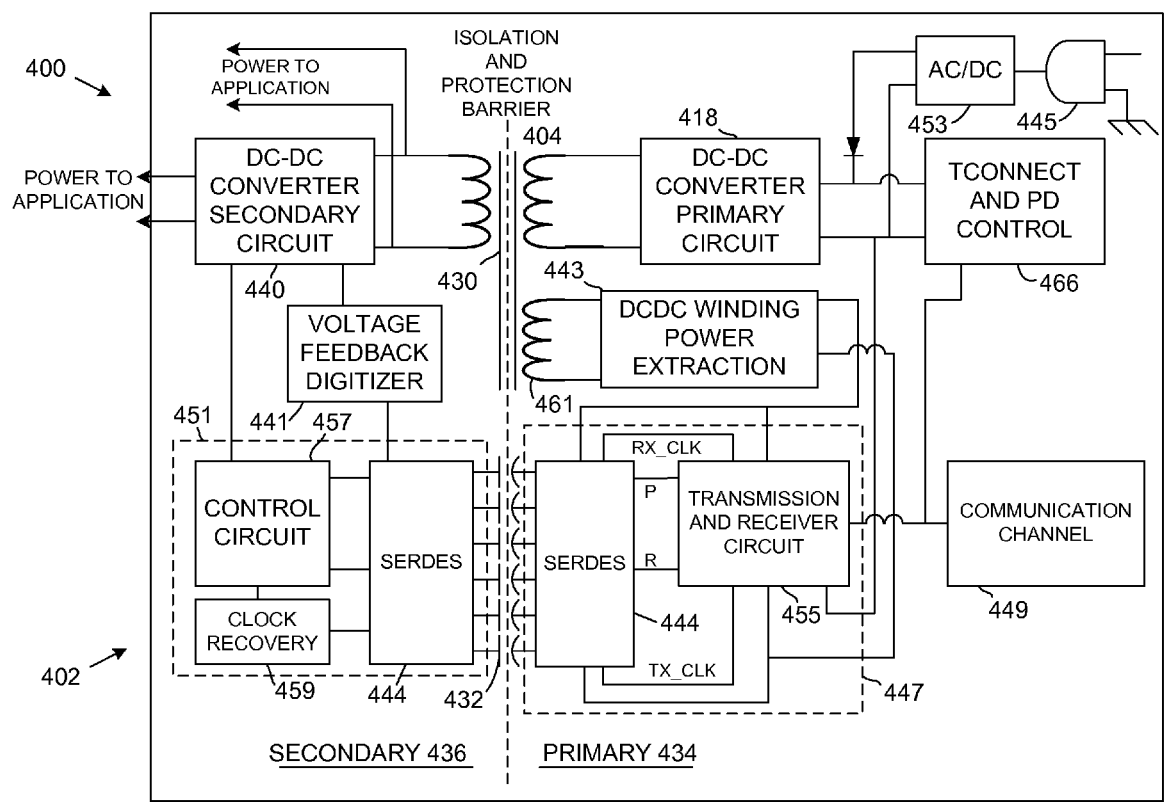
FIGS. 4A and 4B are schematic block and circuit diagrams showing embodiments of isolated Ethernet PHYs configured as a Power-over-Ethernet (PoE) devices in a powered device (PD) architecture.

Referring to FIG. 4A, a schematic block and circuit diagram illustrates an embodiment of an isolated Ethernet PHY 402 configured as a Power-over-Ethernet (PoE) device 400 comprising a transformer connect (Tconnect) and powered device (PD) control circuit 466.

As shown, the Ethernet PHY 402 further comprises a power transformer isolation barrier 430 and a communication isolation barrier 432. First 434 and second 436 circuits are coupled across the communication isolation barrier 434 and the power transformer isolation barrier 432 and are configured to transfer power across the power transformer isolation barrier 432 and communicate data across the communication isolation barrier 434 including power feedback data that controls power transfer across the transformer isolation barrier 432.

The network device 400 depicted in FIG. 4A is a Power-over-Ethernet (PoE) device implemented in a powered device 466 configuration. The illustrative Ethernet PHY 402 with internal isolation comprises an isolation and protection barrier 404 which is operative for isolated power and signal transfer and a primary circuit 434 and a secondary circuit 436 that communicate across the isolation and protection barrier 404. The isolation and protection barrier 404 comprising a power transfer isolation barrier 430 and a data communication isolation barrier 432. The primary circuit 434 comprises a power extraction circuit 443 that receives power from a power source 445, a Direct Current (DC)-DC converter primary circuit 418 coupled to the power extraction circuit 443, and a primary communication interface 447 coupled to a communication channel 449 for communicating data. The secondary circuit 436 comprises a DC-DC converter secondary circuit 440 configured to receive power transferred from the DC-DC converter primary circuit 418 through the power transfer isolation barrier 430, and a feedback circuit 441 coupled to a secondary communication interface 451 and configured to receive feedback control data passed through the data communication isolation barrier 432 and control power transfer according to the feedback control data.

The secondary circuit 436 further comprises an application power interface coupled to the DC-DC converter secondary circuit 440 which is configured to supply power to an application. A secondary communication interface 451 is configured to communicate data with the primary communication interface 447 through the data communication isolation barrier 432.

In the illustrative embodiment of the Ethernet PHY 402, the power transfer isolation barrier 430 is a transformer and the data communication isolation barrier 432 is a capacitive isolation barrier. The power extraction circuit 443 is coupled to an Alternating Current (AC)/Direct Current (DC) converter 453 coupled a wall jack 445. The primary communication interface 447 comprises a transmitter and receiver circuit 455 and a serializer-deserializer (SERDES) 444 coupled between the transmitter and receiver circuit 455 and the capacitive isolation barrier 432. The secondary communication interface 451 comprises an isolated device control circuit 457 and a serializer-deserializer (SERDES) 444 coupled between the isolated device control circuit 457 and the capacitive isolation barrier 432.

In some embodiments, a transformer connect (Tconnect) and powered device (PD) control circuit 466 can be coupled to the Direct Current (DC)-DC converter primary circuit 418 and the communication channel 449. A power extraction winding 461 is coupled to the power extraction circuit 443.

Figure 4B:
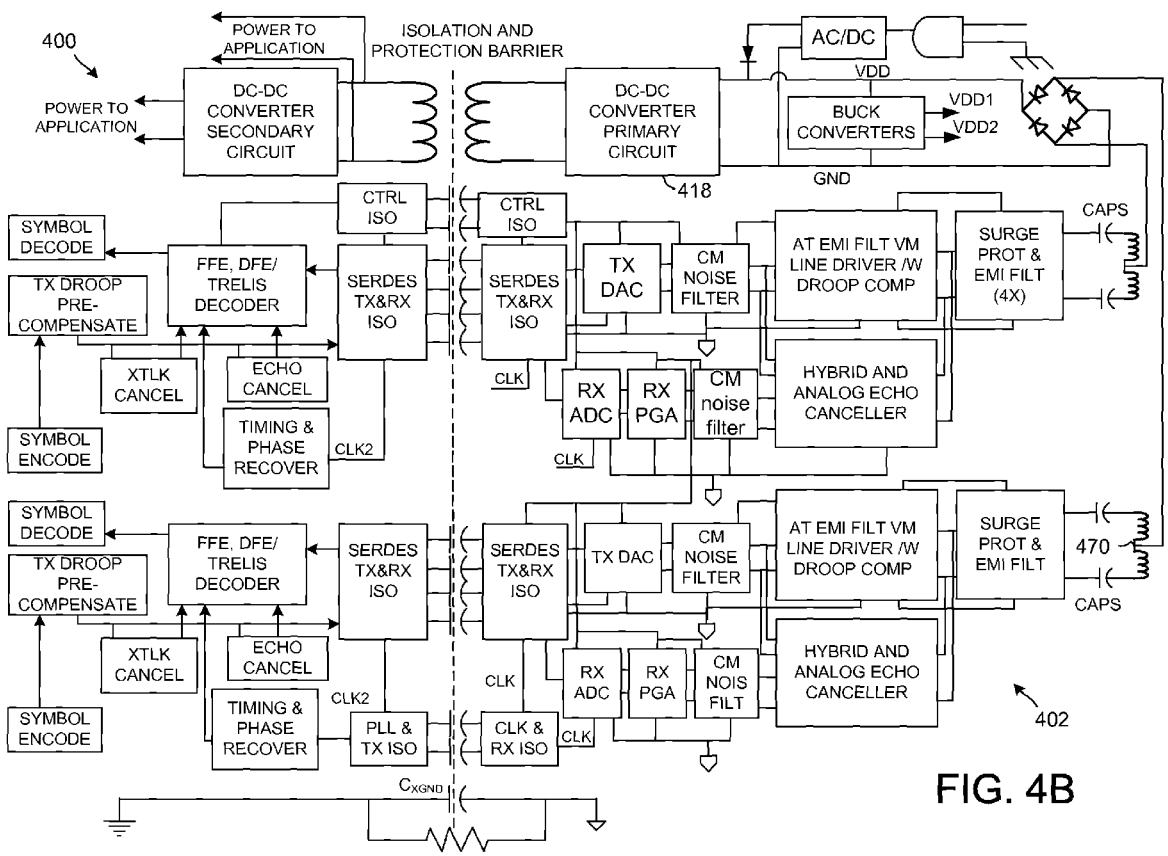

Referring to FIG. 4B, a schematic circuit and block diagram illustrates another embodiment of a network device 400 including an Ethernet PHY 402 in a powered device (PD) architecture. A DC-DC converter primary circuit 418 supplies power to an autotransformer 470 or inductors at a suitable voltage to communication channels.

The DC-DC converter primary circuit 418 produces one primary voltage, and further additional voltages can be produced with voltage regulators or additional switches such as the autotransformers 470.

Figure 5A:
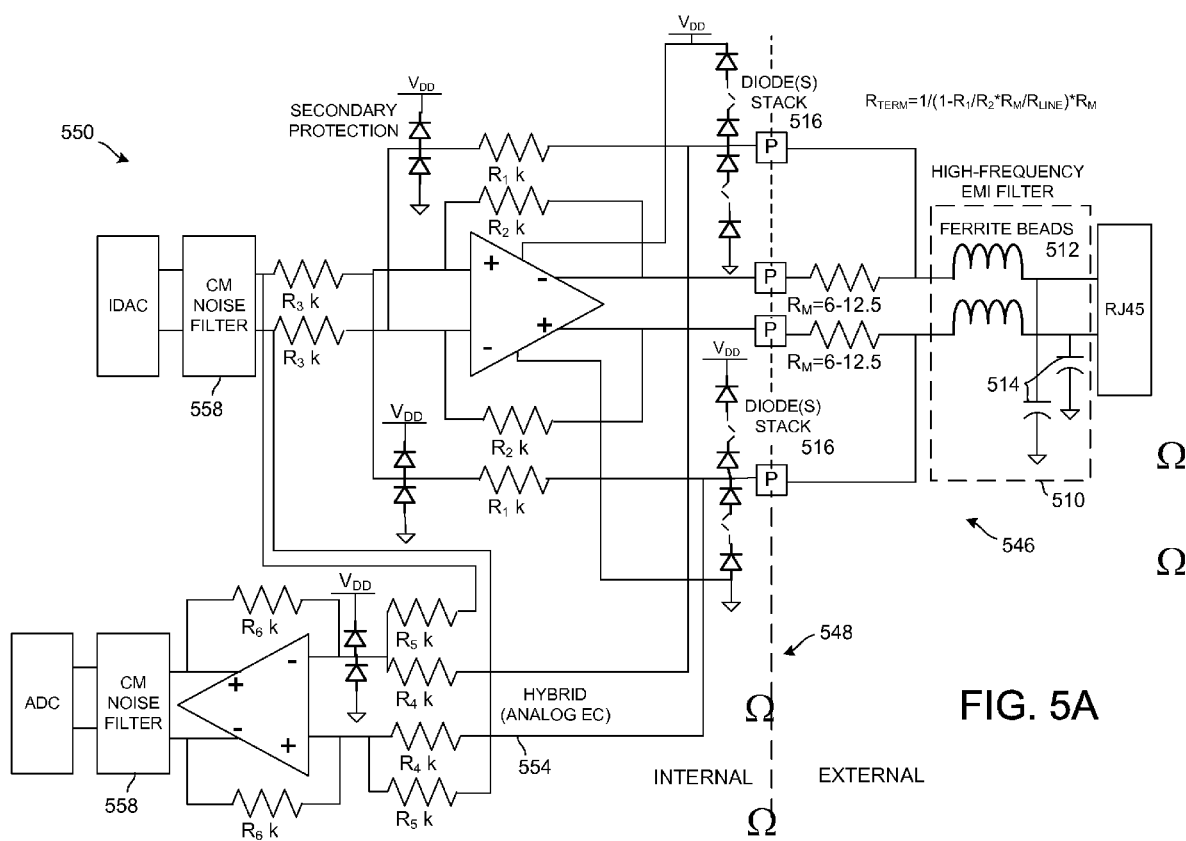
FIGS. 5A and 5B are schematic block and circuit diagrams illustrating embodiments of line drivers that can be used in the illustrative isolated Ethernet PHY.
Figure 5B:
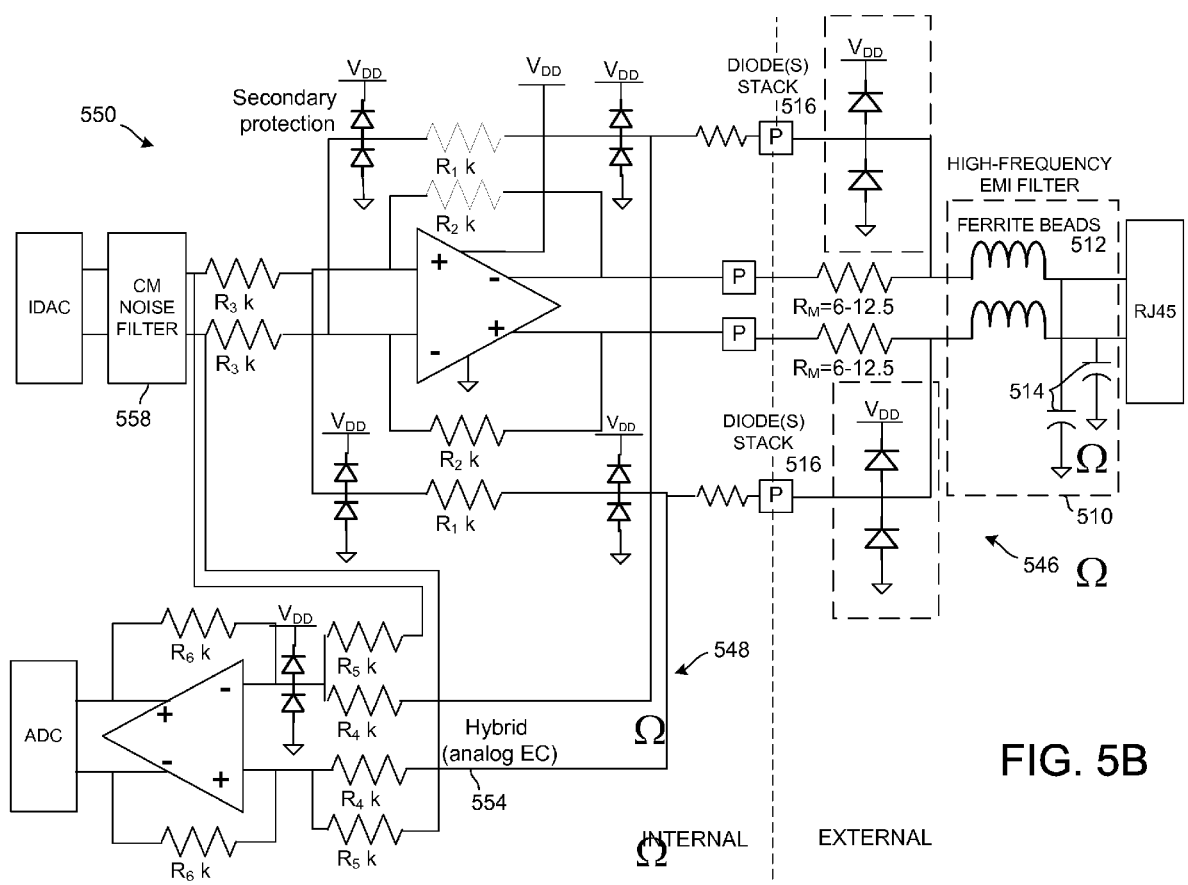

Referring to FIGS. 5A and 5B, schematic block and circuit diagrams illustrate embodiments of line drivers 550 that can be implemented in the illustrative isolated Ethernet PHY. The line drivers 550 are depicted in a transmitter channel 546 and can incorporate selected functional components. The illustrative line drivers 550 have active termination, although other suitable arrangements can omit active termination. The illustrative line drivers 550 also include a high-frequency EMI filter 510, for example implemented with ferrite beads 512, capacitors 514, and diodes 516 that specifically address EMI. Other arrangements can omit the EMI filter. In various embodiments, the line driver can be a current mode or voltage mode line driver. FIG. 5A depicts a terminated line driver 550 and an active EMI suppression circuit 510 including common mode noise filters 558 in both transmitter 546 and receiver 548 channels.

A receiver channel 548 includes a hybrid and analog echo canceller 554 and may be configured with a common-mode noise filter 558 which is included in FIG. 5B and omitted in the circuit depicted in FIG. 5A. Common mode noise can be handled in a layered or progressive fashion with filtering incorporated at different locations in the architecture so that very little common mode noise is passed onto the line. Impedance can be controlled as part of the active termination to reduce or prevent radiation of emission from the board. In some implementations, the common-mode noise filter 558 can be constructed for layered noise rejection by forming structures such as moats in the circuitry, for example blank sections of silicon with no implants. The silicon moats form passing lines with RC filtering. A signal passed across a moat in a form of active circuitry enables a layered approach to common mode noise filtering.

Layered handling of common mode noise and surge protection can also be implemented. Furthermore, some embodiments may include current mode DC-DC conversion for reduced EMI. For example, EMI can be reduced by including a balanced line driver which drives signals in a balanced or controlled manner to produce less emission.

Figure 6:
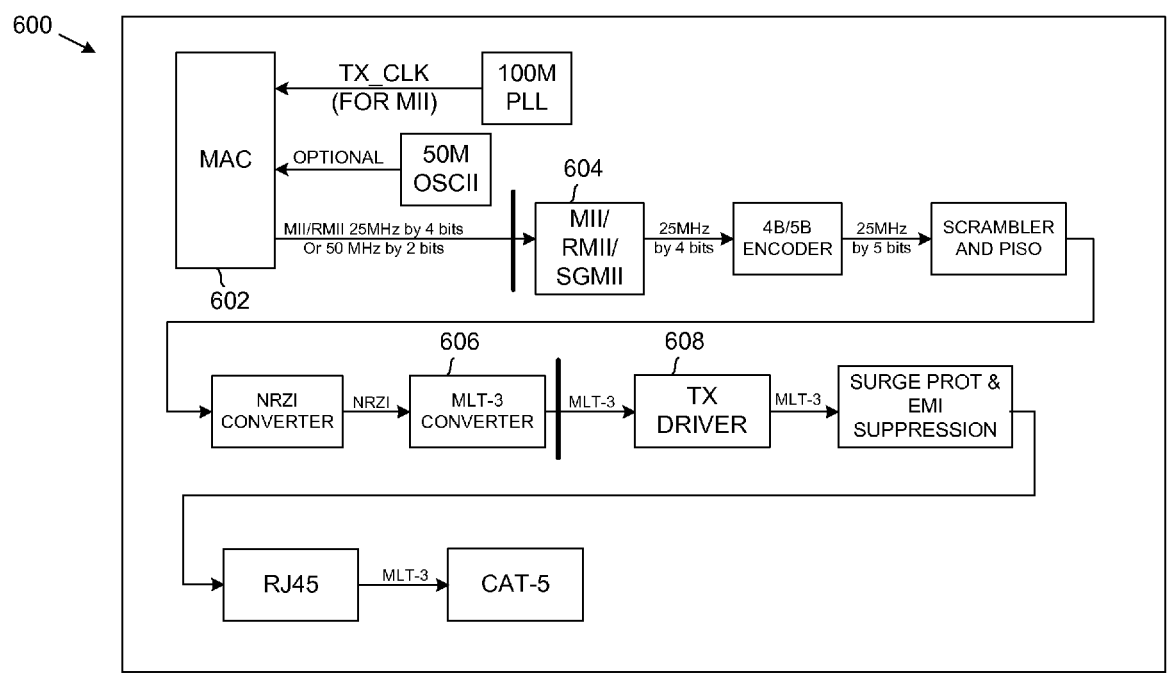
FIG. 6 is a schematic block diagram that depicts an embodiment of a transmitter system in a communication system and shows an example of isolation partitioning lines for a digital isolation barrier.

Referring to FIG. 6, a schematic block diagram illustrates an embodiment of a transmitter system 600 in a communication system and shows an example of isolation partitioning lines for a digital isolation barrier. The digital isolation barrier can be configured as a 10/100/1000/10000 Ethernet transmitter system that partitions a communication pathway between the powered system and the isolated system at a partitioning line selected from between a media access control (MAC) block 602 and a media independent interface/reduced media independent interface (MII/RMII) block 604 and from between a digital portion of the transmitter system 606 and an analog transmit (TX) driver 608.

The illustrative 10/100M transmitter system 600 can include a serializer/deserializer (SERDES) interface. Selected points of isolation can be at the MII/RMII interface 604 which is a highly desirable location, Serial Gigabit Media Independent Interface (SGMII), or at a location between the transmit drive circuitry 608 and the MLT3-coded converter 606 where a three-level signal is present that enables a simple interface.

For an isolation point at the MII/RMII 604, then the SGMII is a serial interface designed to do the MII/RMII interface serially so the SGMII core can be an implementation of the high-speed SERDES interface. If the partition is selected between the MLT-3 converter 606 and the TX driver 608, a more generic serial block can be used.

A communication isolation barrier can be configured as a 10/100/1000/10000 Ethernet transmitter system that partitions a communication pathway between the secondary circuit and the primary circuit at a partitioning line selected from between a media access control (MAC) block and a media independent interface/reduced media independent interface (MII/RMII) block and from between a MLT-3 converter and a transmit (TX) driver.

Figure 7:
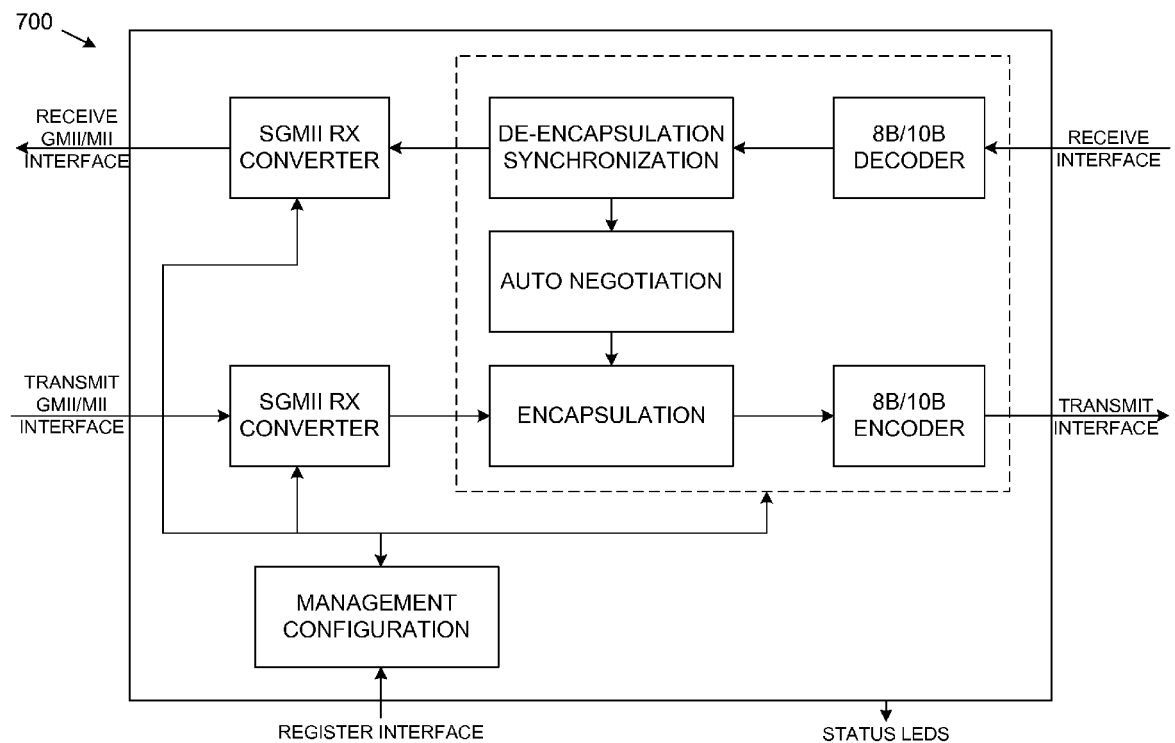
FIG. 7 is a schematic block diagram that depicts an embodiment of a Serial Gigabit Media Independent Interface (SGMII) core.

FIG. 7 is a schematic block diagram that depicts an embodiment of a Serial Gigabit Media Independent Interface (SGMII) core 700. An isolation system can further comprise the power transfer isolation barrier implemented as one or more transformers and the data communication isolation barrier implemented as a capacitive isolation barrier. The secondary communication interface can comprise a transmitter and receiver circuit and a Serial Gigabit Media Independent Interface (SGMII) coupled between the transmitter receiver circuit and the capacitive isolation barrier. The primary communication interface can comprise an isolated device control circuit and a Serial Gigabit Media Independent Interface (SGMII) coupled between the isolated device control circuit and the capacitive isolation barrier.

In another embodiment, an isolation system can comprise the power transfer isolation barrier implemented as a transformer and the data communication isolation barrier implemented as a capacitive isolation barrier. The secondary communication interface can comprise a transmitter and receiver circuit and a Management Data Input/Output (MDIO) interface coupled between the transmitter receiver circuit and the capacitive isolation barrier. The primary communication interface can comprise an isolated device control circuit and a Management Data Input/Output (MDIO) interface coupled between the isolated device control circuit and the capacitive isolation barrier.

Figure 8:
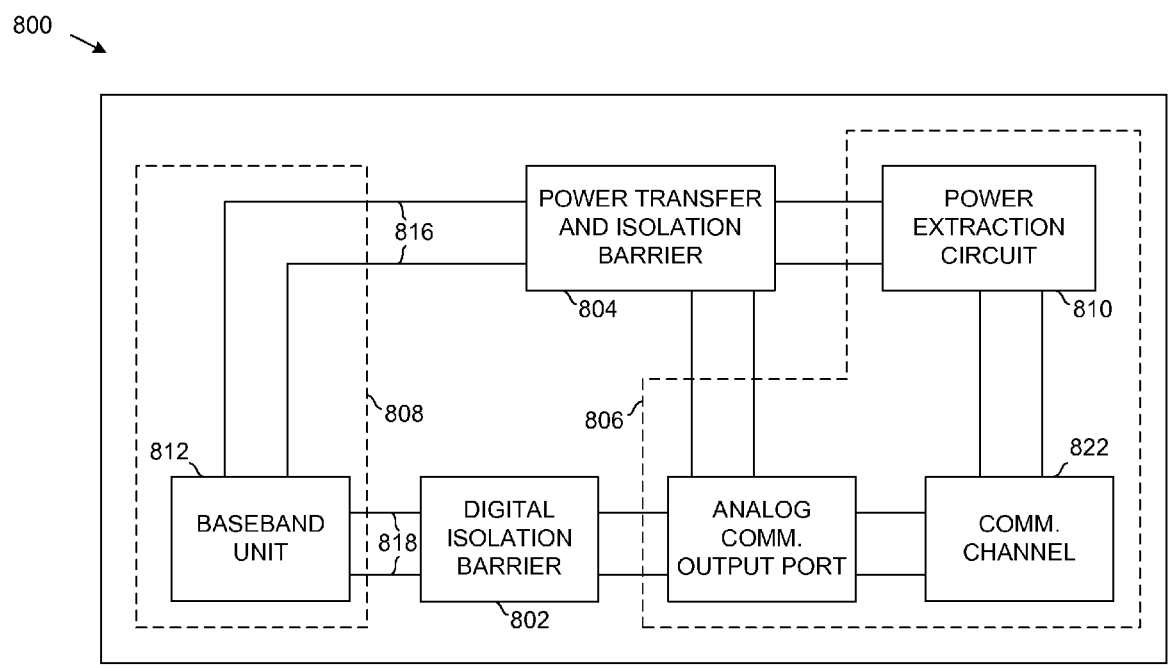
FIG. 8 is a schematic block diagram showing an embodiment of a communication device that is adapted for communicating across an isolation barrier.

Referring to FIG. 8, a schematic block diagram illustrates an embodiment of a communication device 800 that is adapted for communicating across an isolation barrier. The communication device 800 comprises a powered system 806 and an isolated system 808 which are configured to bidirectionally communicate with the powered system 806. A power transfer isolation barrier 804 is configured to transfer power while maintaining isolation between the powered system 806 and the isolated system 808. A digital isolation barrier 802 configured to communicate digital communication signals between the powered system 806 and the isolated system 808. The power transfer isolation barrier 804 is distinct from the digital isolation barrier 802.

The illustrative power transfer isolation barrier 804 is configured to partition a power transfer pathway 816 between the powered system 806 and the isolated system 808 independently of partitioning of a communication pathway 818.

Similarly, in some embodiments the digital isolation barrier 802 can be configured to partition a communication pathway 818 between the powered system 806 and the isolated system 808 independently of partitioning of a power transfer pathway 816.

In some embodiments, the power transfer isolation barrier 804 can be configured to transfer power from the powered system 806 to the isolated system 808 and the digital isolation barrier 802 can be configured to communicate digital communication signals bidirectionally between the powered system 806 and the isolated system 808.

Similarly, in other embodiments the power transfer isolation barrier 804 can be configured to transfer power from the isolated system 808 to the powered system 806. The isolated system 808 receives power from the application and transfers the received power to the powered system 806, so that power extraction 810 is superfluous and can be eliminated. The digital isolation barrier 802 can be configured to communicate digital communication signals bidirectionally between the powered system 806 and the isolated system 808.

Figure 9:
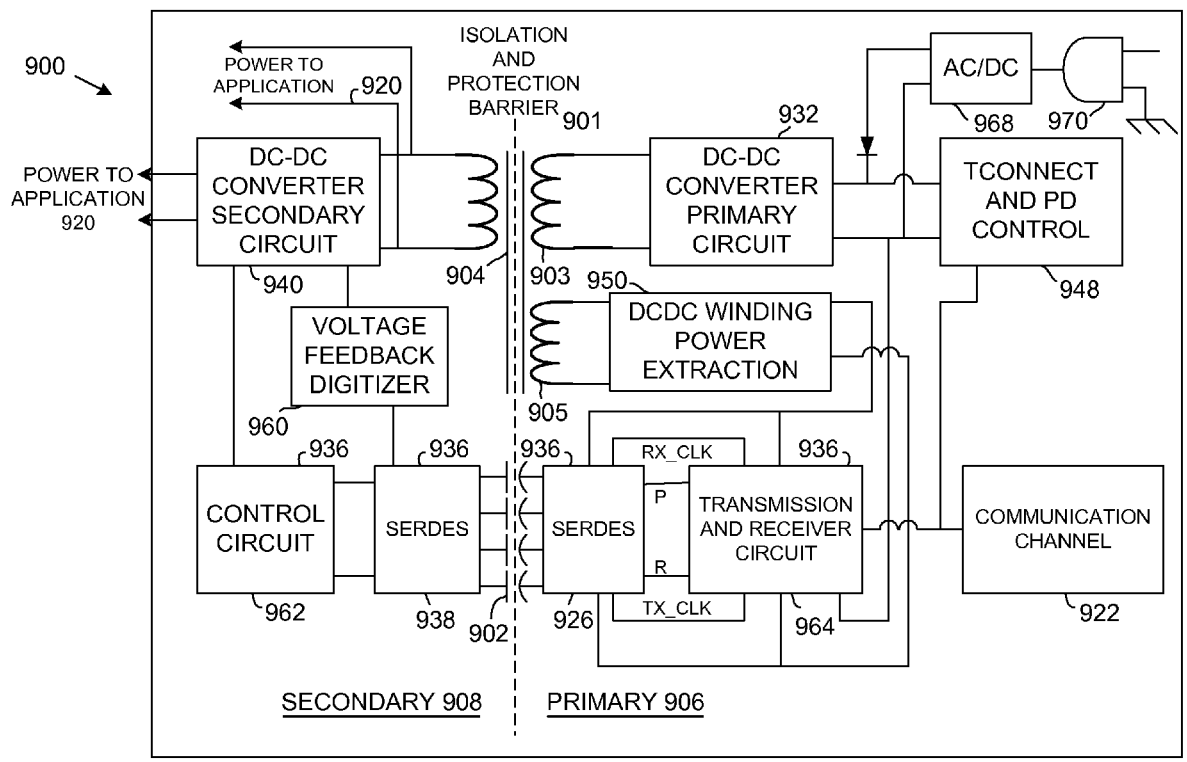
FIG. 9 is a schematic block diagram that depicts an embodiment of a communication system that includes an isolation barrier.

Referring to FIG. 9, a schematic block diagram illustrates an embodiment of a communication system 900 that includes an isolation barrier. The illustrative communication system 900 comprises a transformer isolation barrier 904 and first 906 and second 908 circuits. The transformer isolation barrier 904 comprises a power winding 903 and a feedback winding 905. The first 906 and second 908 circuits are coupled across the transformer isolation barrier 904 and configured to transfer power across the power winding 903 and communicate power feedback data across the feedback winding 905 that controls power transfer across the transformer isolation barrier 904.

The illustrative communication system 900 can further comprise a capacitive isolation barrier 902. The first 906 and second 908 circuits can be coupled across the capacitive isolation barrier 902 and configured to communicate data across the capacitive isolation barrier 902.

Referring again to FIG. 9, another embodiment of an isolation system 900 that can be used in a Power-over-Ethernet application. The illustrative isolation system 900 comprises a primary circuit 906 and a secondary circuit 908 that communicate across an isolation barrier 901. The isolation barrier 902 comprising a power transfer isolation barrier 904 and a data communication isolation barrier 902. The primary circuit 906 can comprise a power extraction circuit 950 that receives power from a power source 970, a DC-DC converter primary circuit 932 coupled to the power extraction circuit 950, and a primary communication interface 926 coupled to a communication channel 922 for communicating data. The secondary circuit 908 can comprise a DC-DC converter secondary circuit 940 configured to received power transferred from the DC-DC converter primary circuit 932 through the power transfer isolation barrier 904, an application power interface 920 coupled to the DC-DC converter secondary circuit 940 configured to supply power to an application, a secondary communication interface 938 configured to communicate data with the primary communication interface 926 through the data communication isolation barrier 902, and a feedback circuit 960 coupled to the secondary communication interface 938 that transmits feedback control data through the data communication isolation barrier 902 and controls power transfer according to the feedback control data.

In some embodiments, the isolation system 900 can further comprise the power transfer isolation barrier 904 can comprise a transformer and the data communication isolation barrier 902 can comprise a capacitive isolation barrier. The power extraction circuit 950 can comprise an Alternating Current (AC)/Direct Current (DC) converter 968 coupled a wall jack 970. The illustrative primary communication interface 926 comprises a transmitter and receiver circuit 964 and a serializer-deserializer (SERDES) 966 coupled between the transmitter receiver circuit 964 and the capacitive isolation barrier 902. The secondary communication interface 938 can comprise an isolated device control circuit 936 and a serializer-deserializer (SERDES) 966 coupled between the isolated device control circuit 936 and the capacitive isolation barrier 902.

Some implementations of the isolation system 900 can also comprise a transformer connect (Tconnect) and power device (PD) control circuit 948 coupled to the DC-DC converter primary circuit 932 and the communication channel 922. The isolation system 900 can also comprise a DC-DC power extraction winding 972 coupled to the Tconnect and PD control circuit 948 coupled to the DC-DC converter primary circuit 932 and the primary communication interface 926.

In some implementations, the isolation system 900 can comprise first and second integrated circuit dies that respectively integrate the primary circuit 906 and the secondary circuit 908.

Some isolation system implementations can further comprise a physical layer (PHY) controller with a third integrated circuit die integrating the PHY controller. The first, second, and third integrated circuit dies, and power circuitry exclusive of transformers in the isolation barrier 901 can be incorporated in a single package.

In still other isolation system implementations, an Ethernet physical layer (PHY) can be used in combination with isolation circuitry and a low voltage power circuit and can be integrated onto third and fourth integrated circuit dies. The first, second, third, and fourth integrated circuit dies, and power circuitry exclusive of transformers in the isolation barrier 901 can be incorporated in a single package including an Ethernet physical layer (PHY), isolation circuit, and low voltage power circuit In an architecture, for example a p-channel metal oxide semiconductor field effect transistor (PMOS) implementation, in which power is sourced from the line or from the transceiver side, the system can be integrated in three integrated circuit (IC) dies. In an example implementation, a three IC die system can have a high voltage SOI process for usage with a 48 volt supply, a standard PMOS process for the Ethernet circuit, and standard CMOS for the baseband circuitry. Circuitry for the primary circuit 906 can be implemented in two integrated circuit dies, and the secondary circuit 908 can be implemented in one die. The digitizer (DC-DC) in the power extraction circuit 950 that feeds back the information that controls the DC-DC converter 932 can be coupled to an extra winding 905 that can have an architecture similar to the architecture of the digital transformer windings 904. The extra winding 905 can be used to power the transceiver. Additional buck converters can be used to implement a power circuit for the transceiver.

Figure 10:
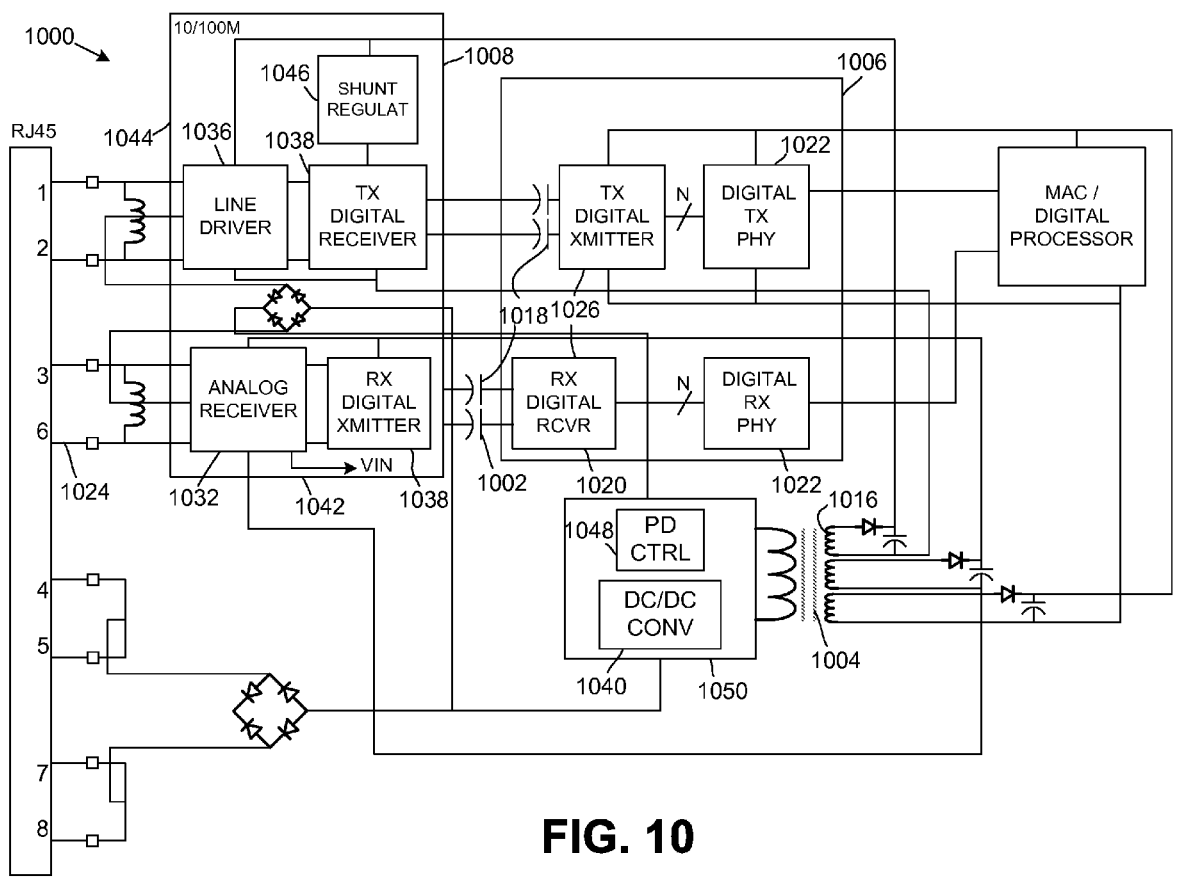
FIG. 10 is a schematic block diagram illustrating an embodiment of a communication system that partitions signal communication and power transfer across an isolation barrier.

Referring to FIG. 10, a schematic block diagram depicts an embodiment of a communication system 1000 that partitions signal communication and power transfer across an isolation barrier for a 10/100M Ethernet application. The communication system 1000 comprises a secondary circuit 1006 and a primary circuit 1008 that is adapted to communicate with the secondary circuit 1006. A power transfer isolation barrier 1004 is coupled between the secondary circuit 1006 and the primary circuit 1008 and is configured to transfer power while maintaining isolation between the secondary 1006 and primary 1008 circuits. A communication isolation barrier 1002 distinct from the power transfer isolation barrier 1004 is coupled between the secondary circuit 1006 and the primary circuit 1008 and is configured to transfer data between the secondary circuit 1006 and the primary circuit 1008.

In the illustrative embodiment, the second circuit 1008 can comprise a communication channel 1022 configured for coupling to a network line 1024 to communicate information, a transmission and receiver circuit 1020 coupled to the communication channel 1022 for transmitting and/or receiving the communicated information, and a digital interface 1026 coupled to the transmission and receiver circuit 1020 and configured to communicate digital information over the communication isolation barrier 1002. The primary circuit 1008 can further comprise a DC-DC converter primary circuit 1040 coupled to the transmission and receiver circuit 1020 and the digital interface 1026 which is configured to transfer power over the power transfer isolation barrier 1004. The primary circuit 1008 can comprise an application unit 1044 that transmits and/or receives the communicated information, a digital interface 1038 coupled to the application unit 1044 that can communicate digital information over the communication isolation barrier 1002, and a DC-DC converter primary circuit 1036 coupled to the application unit 1044 and the digital interface 1038. The DC-DC converter primary circuit 1036 is configured to transfer power over the power transfer isolation barrier 1004.

Suitable DC-DC converter components can be full-bridge or half-bridge rectified DC-DC converters enabling minimization of common-mode noise. Other DC-DC converters can also be flyback converters, forward converters, or any other suitable type of converter. In communication system 1000 a multiple output flyback converter is illustrated. A synchronous full-bridge or half-bridge rectified DC-DC converter can improve the efficiency and reduce common-mode noise.

The secondary circuit transmission and receiver circuit 1020 and digital interface 1026, and the primary circuit application unit 1044 and digital interface 1038 can be configured to pass feedback control signals over the digital isolation barrier 1002 that control transfer of power over the power transfer isolation barrier 1004.

In other embodiments, the communication system 1000 can be configured as a Power-over-Ethernet (PoE) system. For example, the secondary circuit 1006 can comprise a power connection that supplies power to the DC-DC converter secondary circuit 1040, a Tconnect and powered device (PD) controller 1048 coupled to the DC-DC converter secondary circuit 1040, and a power extraction circuit 1050 coupled to the secondary circuit digital interface 1026 that is configured to controllably transfer additional power over the power transfer isolation barrier 1004. The primary circuit 1008 can further comprise a power connection that supplies power from the DC-DC converter primary circuit 1036 to an application system 1044 and a feedback digitizer coupled between the primary circuit digital interface 1038 and the DC-DC converter primary circuit 1036 that is configured to control power transfer over the power transfer isolation barrier 1004 using feedback control.

In the various illustrative embodiments, the secondary circuit and primary circuit digital interfaces 1026, 1038 can be a serializer/deserializer (SERDES) interface, a Serial Gigabit Media Independent Interface (SGMII), or any other suitable interface.

In some embodiments, the communication isolation barrier 1002 can form an isolated transmission pathway that comprises one or more capacitors and the power transfer isolation barrier 1004 can form an isolated power transfer pathway comprising a power transformer. The communication isolation barrier 1002 can be a capacitive isolation barrier, an electrostatic isolation barrier, a transformer isolation barrier, a serializer/deserializer (SERDES) isolation barrier, a magnetic isolation barrier, an optical isolation barrier, a thermal isolation barrier, a resistive isolation barrier, a piezoelectric isolation barrier, or any other suitable isolation barrier. The power transfer isolation barrier 1004 can be a power transformer, a high-voltage switched-capacitor power circuit, a piezoelectric ceramic power converter, a power transfer device, or other suitable device.

The SERDES is similar to a digital isolator, but typically depends on high-frequency modulation and the frequency of modulation to communicate signals. In contrast, a basic digital isolator communicates based on signal edges enabling data communication to very low frequencies, down to DC. Many different examples of digital isolators can be implemented, for example MLT-3 encoder that can be a two-bit interface or a three level interface and enables simple encoding.

The power transfer isolation barrier 1004 in some implementations can be configured to transfer power from the secondary circuit 1006 to the primary circuit 1008 with the communication isolation barrier 1002 configured to communicate digital communication signals bidirectionally between the secondary circuit 1006 and the primary circuit 1008.

The power transfer isolation barrier 1004 in other implementations can be configured to transfer power from the primary circuit 1008 to the secondary circuit 1006 with the communication isolation barrier 1004 configured to communicate digital communication signals bidirectionally between the secondary circuit 1006 and the primary circuit 1008.

The illustrative communication system 1000 can be implemented in a Power-over-Ethernet (PoE)-type application that includes a transceiver that can be a DC-DC converter 1040 and transformer 1004 and has feedback to the line side with the digital transmitter and receiver.

Figure 11A:
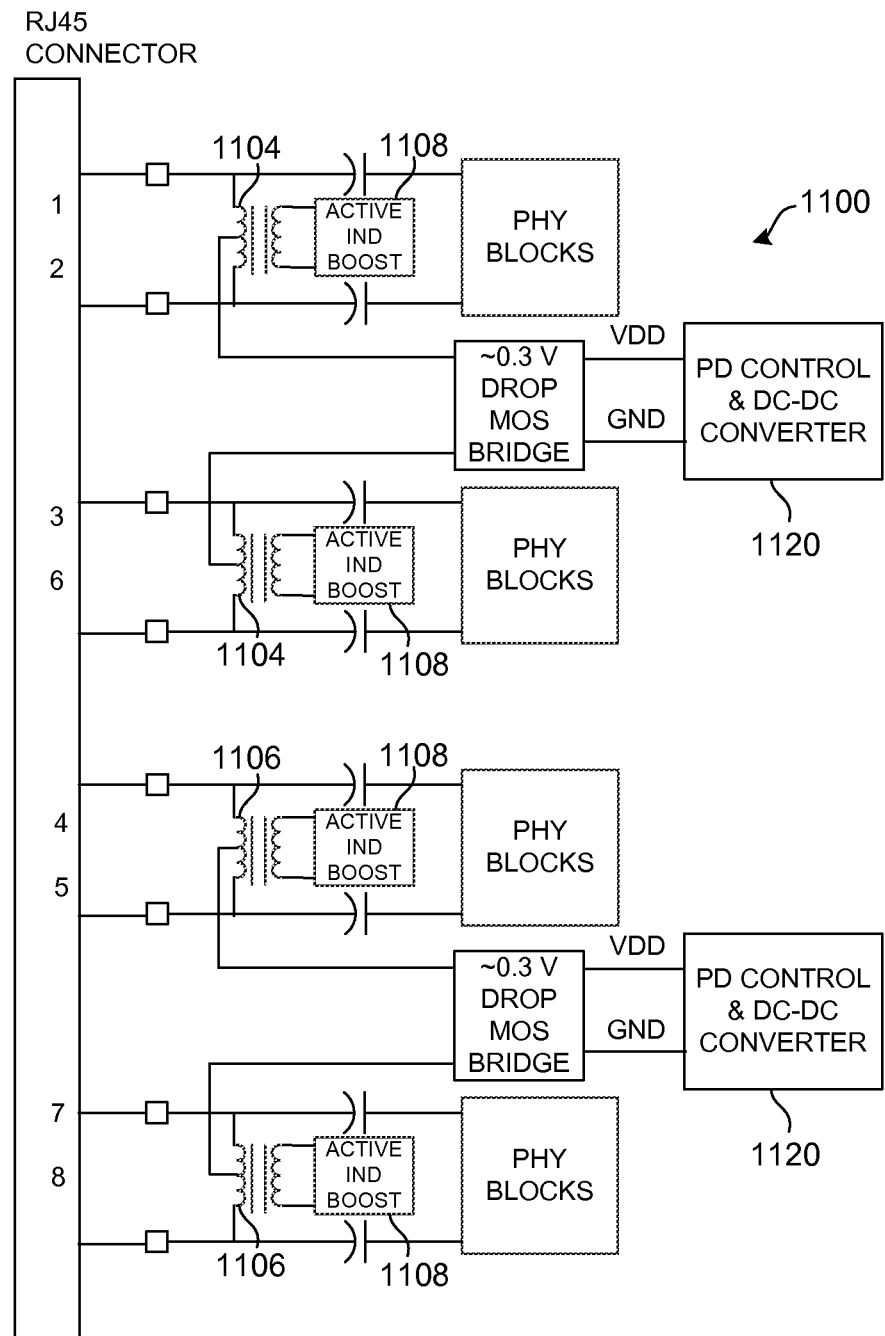
FIG. 11A is a diagram of an example of a configuration for a network interface device that includes active boosting circuits for a magnetic transformer and diode bridges to rectify power signals received from the transformers.

Referring to FIG. 11A, a schematic circuit diagram of an embodiment of powered device (PD) interface 1100 is shown that is suitable for use as a PD interface. PD interface 1100 includes connector coupled to active inductance boost transformers 1104, 1106 that include primary and secondary windings. Transformers 1104 are connected across line pairs 1 and 2, and 3 and 6. Transformers 1106 are connected across line pairs 4 and 5, and 7 and 8. Active inductance boost circuits 1108 are coupled to respective secondary windings of transformers 1104, 1106. Capacitors 1110 are coupled between transformers 1104, 1106 and PHY layer modules. Electronic loads (ELOAD) are coupled in parallel between respective transformers 1104, 1106 and PHY layer modules.

The purpose of using either an autotransformer or a traditional transformer is to provide high impedance at as low a frequency as possible to avoid affecting the data signal. High impedance can be achieved with large inductance, which is physically large and costly. Active inductance boost circuits 1108 reduce the size of the inductance needed. During an over-voltage event, active boost circuits 1108 will not function because the high currents will saturate the core of the transformer. Because the inductance is much smaller than in a traditional transformer, the inductor quickly shorts out and provides an excellent current discharge path. This would also happen in a traditional transformer, but because the inductance is so much smaller the voltage excursion during the over-voltage event, which could affect the PHY devices, is also much smaller.

Figure 11B:
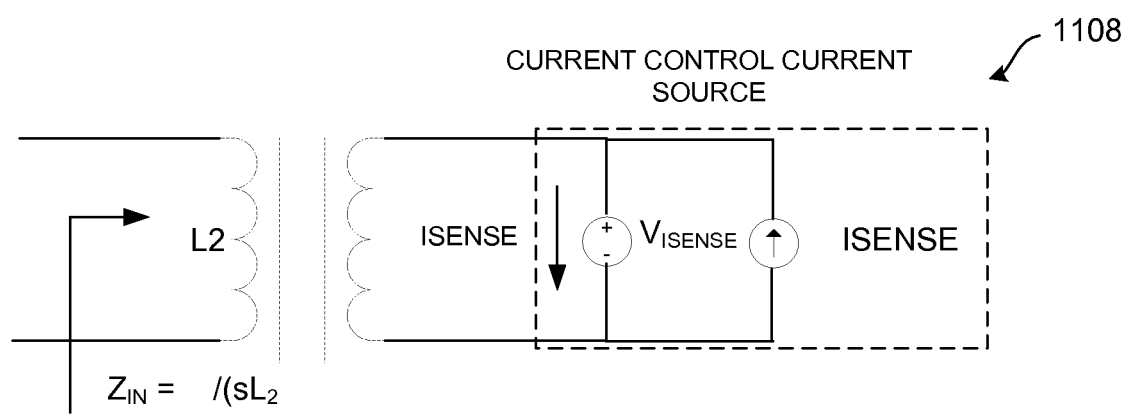
FIG. 11B is a diagram of an embodiment of an active inductance boost circuit.

FIG. 11B shows an embodiment of active inductance boost circuit 1108 coupled to the secondary winding of transformer 1104 that can be used in PD interface 1100 to reduce the size of the transformer component and avoid other problems associated with other types of transformers. Boost circuit 1108 typically includes an active circuit (not shown) that senses the current from transformer 1104 and feeds back a proportional amount of current. Primary and secondary windings of transformer 1108 typically have a 1:1 ratio. A feedback gain factor ($\alpha$) is applied to the sensed current ($i_{sense}$) to increase the impedance (z) on the primary side of transformer 1104. The increase in impedance on the primary side of transformer 1104 is (1/(1−$\alpha$)), where $\alpha$ is typically close to, but less than one (1). The impedance ($Z_{in}$) on the primary side of transformer 1104 is given by:

$$Z_{in} = sL_2/(1-\alpha)$$

where s=frequency of the input signal, $L_2$ is the inductance of the primary winding, and $\alpha$ is feedback gain factor.

Note that active inductance boost circuit 1108 reduces the requirement for surge protection compared to an autotransformer or traditional transformer due to the fact that the required inductance is achieved with boost transformer 1108 rather than a larger transformer. Note that smaller transformers 1104, 1106 will saturate at a much lower current. Thus, in an over-voltage event, capacitors (not shown) in PD controller 1120 effectively short out the lines to chassis (or earth) ground and limit the energy provided to PHY layer module. In some embodiments, over-voltage protection circuitry can be included with rectifier circuit in addition to, or instead of, using capacitors in PD controller 1120.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, component values, integrated circuit process variations, temperature variations, rise and fall times, and/or thermal noise. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, various aspects or portions of a communication or isolation system are described including several optional implementations for particular portions. Any suitable combination or permutation of the disclosed designs may be implemented.

What is claimed is:

1. A network device comprising:
   an Ethernet physical layer (PHY) comprising an isolation, protection, and electromagnetic interference suppression barrier operative for isolated power and data transfer, wherein the Ethernet physical layer (PHY) comprises:
   an isolator coupled internal to the Ethernet physical layer (PHY) configured whereby the Ethernet PHY is directly connectable to a network line with surge and electromagnetic interference (EMI) protection.

2. The network device according to claim 1 further comprising:
   the Ethernet physical layer (PHY) configured as a non-Power-over-Ethernet (non-PoE) device.

3. The network device according to claim 1 further comprising:
   the Ethernet physical layer (PHY) configured as a Power-over-Ethernet (PoE) device.

4. The network device according to claim 1 further comprising:
   the Ethernet physical layer (PHY) configured as a Power-over-Ethernet (PoE) device comprising: a power sourcing equipment (PSE) controller; and
   a PSE power feed operative to source power for a powered device (PD).

5. The network device according to claim 1 further comprising:
   the Ethernet physical layer (PHY) configured as a Power-over-Ethernet (PoE) device comprising:
   a transformer connect (Tconnect) and powered device (PD) control circuit.

6. The network device according to claim 1 further comprising:
   the Ethernet physical layer (PHY) configured as a Power-over-Ethernet (PoE) device comprising:
   a powered device (PD) control circuit and power inductors.

7. The network device according to claim 1 further comprising:
   the Ethernet physical layer (PHY) comprising:
   a power transformer isolation barrier; a capacitive isolation barrier; and
   first and second circuits coupled across the capacitive isolation barrier and the power transformer isolation barrier and configured to transfer power across the power transformer isolation barrier and communicate data across the capacitive isolation barrier including power feedback data that controls power transfer across the power transformer isolation barrier.

8. The network device according to claim 1 further comprising:
   the Ethernet physical layer (PHY) comprising:
   a power transformer isolation barrier;
   a communication isolation barrier; and
   first and second circuits coupled across the communication isolation barrier and the power transformer isolation barrier and configured to transfer power across the power transformer isolation barrier and communicate data across the communication isolation barrier including power feedback data that controls power transfer across the transformer isolation barrier.

9. The network device according to claim 1 further comprising:
   the Ethernet physical layer (PHY) comprising:
   a power transformer isolation barrier;
   a capacitive isolation barrier;

primary and secondary DC-DC converters operative to transfer power across the power transformer isolation barrier;

a voltage feedback digitizer coupled to the secondary DC-DC converter configured to generate a voltage feedback signal; and at least one control isolator operative to communicate the voltage feedback signal across the capacitive isolation barrier to the primary DC-DC converter.

10. The network device according to claim 9 further comprising:

the Ethernet physical layer (PHY) comprising:

receiver and transmitter serializer/deserializer (SERDES) isolators operative to communicate the voltage feedback signal across the capacitive isolation barrier;

a transmitter channel and a receiver channel coupling the receiver and transmitter serializer/deserializer (SERDES) isolators directly to a line; and the transmitter channel comprising:

an active termination, electromagnetic interference (EMI), voltage mode line driver coupled directly to the line; and a transmitter digital to analog converter (DAC) coupled between the line driver and the transmitter SERDES isolator; and the receiver channel comprising:

a hybrid and analog echo canceller coupled directly to the line; and a receiver analog to digital converter (ADC) coupled between the line driver and the transmitter SERDES isolator.

11. The network device according to claim 10 further comprising:

the transmitter channel further comprising a common mode noise filter coupled between the active termination, electromagnetic interference (EMI), voltage mode line driver, and the transmitter digital to analog converter (DAC); and the receiver channel further comprising a common mode noise filter coupled between the hybrid and analog echo canceller, and the receiver analog to digital converter (ADC).

12. The network device according to claim 1 further comprising:

the Ethernet physical layer (PHY) comprising:

a capacitive isolation barrier internal to the Ethernet PHY; and receiver and transmitter control isolators internal to the Ethernet PHY and coupled across the capacitive isolation barrier.

13. The network device according to claim 1 further comprising:

the Ethernet physical layer (PHY) comprising:

a capacitive isolation barrier internal to the Ethernet PHY; and receiver and transmitter serializer/deserializer (SERDES) isolators internal to the Ethernet PHY and coupled across the capacitive isolation barrier and operative to communicate data across the capacitive isolation barrier.

14. The network device according to claim 13 further comprising:

the Ethernet physical layer (PHY) further comprising:

a surge protection and electromagnetic interference (EMI) suppression filter coupling the receiver channel and the transmitter channel directly to the line.

15. The network device according to claim 1 further comprising:

the Ethernet physical layer (PHY) comprising:

a capacitive isolation barrier internal to the Ethernet PHY; and a clock receiver isolator and a phase-locked loop (PLL) transmitter isolator internal to the Ethernet PHY and coupled across the capacitive isolation barrier and operative to transfer clock signals across the capacitive isolation barrier.

16. The network device according to claim 15 further comprising:

the clock receiver isolator and phase-locked loop (PLL) transmitter isolator operative in combination for clock recovery functionality.

17. The network device according to claim 1 further comprising:

the Ethernet physical layer (PHY) comprising a transformerless gigabit PHY or 10 gigabit PHY.

18. The network device according to claim 1 further comprising:

the Ethernet physical layer (PHY) comprising a 10 gigabit PHY, a gigabit PHY, a 100 megabit PHY, and or a 10 megabit PHY.

19. The network device according to claim 1 further comprising:

at least one isolation barrier internal to the Ethernet physical layer (PHY) selected from a group consisting of a capacitive isolation barrier, an electrostatic isolation barrier, a transformer isolation barrier, an isolation barrier formed by a serializer/deserializer (SERDES), a magnetic isolation barrier, an optical isolation barrier, a thermal isolation barrier, a resistive isolation barrier, and a piezoelectric isolation barrier.

20. The network device according to claim 1 further comprising:

at least one channel across at least one respective isolation barrier internal to the Ethernet physical layer (PHY) selected from a group consisting of a power transfer channel, a control channel, a communication channel, a receive communication channel, a transmit communication channel, and a clock channel.

21. The network device according to claim 1 further comprising:

the Ethernet physical layer (PHY) comprising an isolator internal to the Ethernet PHY operative to transmit a signal through the internal isolation and protection barrier by converting a digital signal to a fast differential edge modulation that tracks process characteristics across the isolation barrier, passing the fast differential edge modulation through the isolation barrier, the Ethernet physical layer (PHY) comprising a 10 gigabit PHY, a gigabit PHY, a 100 megabit PHY, and or a 10 megabit PHY, and differentiating the passed fast differential edge modulation to form a pulse according to a transfer function that amplifies the pulse.

22. The network device according to claim 1 further comprising:

the Ethernet physical layer (PHY) comprising:

at least one active termination line driver internal to the Ethernet PHY and coupled directly to a line.

23. The network device according to claim 1 further comprising:

the Ethernet physical layer (PHY) comprising:

at least one active termination, electromagnetic interference (EMI) filtering, voltage mode line driver internal to the Ethernet PHY and coupled directly to a line.

24. The network device according to claim 1 further comprising:
the Ethernet physical layer (PHY) comprising:
at least line driver comprising at least one functionality selected from a group consisting of active termination, non-active termination, electromagnetic interference (EMI) filtering, voltage mode, and current mode.

25. The network device according to claim 1 further comprising:
the Ethernet physical layer (PHY) configured to transfer power via an external transformer.

26. A network device comprising:
a digitally-activated Ethernet physical layer (PHY) configured for isolated power and data transfer and direct connection to a network line with surge and electromagnetic interference (EMI) protection; and
a power transformer coupled to and external from the Ethernet physical layer (PHY).

27. The network device according to claim 26 further comprising:
the Ethernet physical layer (PHY) configured as a non-Power-over-Ethernet (non-PoE) device or a Power-over-Ethernet (PoE) device.

28. The network device according to claim 26 further comprising:
the Ethernet physical layer (PHY) configured as a Power-over-Ethernet (PoE) device comprising a power sourcing equipment (PSE) controller or a powered device (PD) controller.

29. A network device comprising:
an Ethernet physical layer (PHY) with internal isolation comprising:
an isolation and protection barrier operative for isolated power and signal transfer;
a primary Direct Current (DC)-DC converter and a secondary DC-DC converter that transfer power across a transformer channel of the isolation and protection barrier;
a feedback digitizer coupled to the secondary DC-DC converter that generates a feedback signal based on the transferred power; and
primary and secondary control isolators that communicate the feedback signal across a capacitive channel of the isolation and protection barrier to control power transfer across the transformer channel.

30. The network device according to claim 29 further comprising:
a power transformer external from and coupled to the Ethernet physical layer (PHY).

31. The network device according to claim 29 further comprising:
the Ethernet physical layer (PHY) with internal isolation comprising:
primary and secondary communication isolators that communicate data across a capacitive channel of the isolation and protection barrier.

32. The network device according to claim 29 further comprising:
the Ethernet physical layer (PHY) with internal isolation comprising:
primary and secondary clock isolators that communicate clock signals across a capacitive channel of the isolation and protection barrier.

33. The network device according to claim 29 further comprising:
the Ethernet physical layer (PHY) with internal isolation comprising:
a communication channel across a capacitive isolation channel of the isolation and protection barrier.

34. The network device according to claim 29 further comprising:
the Ethernet physical layer (PHY) with internal isolation comprising:
a communication channel across a capacitive isolation channel of the isolation and protection barrier comprising at least one active termination, electromagnetic interference (EMI) filtering, voltage mode line driver internal to the Ethernet PHY and coupled directly to a line.

35. The network device according to claim 29 further comprising:
the Ethernet physical layer (PHY) with internal isolation comprising:
a communication channel across a capacitive isolation channel of the isolation and protection barrier comprising at least one line driver comprising at least one functionality selected from a group consisting of active termination, non-active termination, electromagnetic interference (EMI) filtering, voltage mode, and current mode.

36. The network device according to claim 29 further comprising:
the Ethernet physical layer (PHY) with internal isolation comprising:
a communication channel across a capacitive isolation channel of the isolation and protection barrier comprising at least one surge protection and electromagnetic interference (EMI) filter coupled directly to a line.

37. The network device according to claim 29 further comprising:
the Ethernet physical layer (PHY) with internal isolation comprising:
a communication channel across a capacitive isolation channel of the isolation and protection barrier comprising:
a transmitter channel and a receiver channel coupling the receiver and transmitter serializer/deserializer (SERDES) isolators directly to a line; and
the transmitter channel comprising:
an active termination, electromagnetic interference (EMI), voltage mode line driver coupled directly to the line; and a transmitter digital to analog converter coupled between the line driver and the transmitter SERDES isolator; and
the receiver channel comprising:
a hybrid and analog echo canceller coupled directly to the line; and
a receiver analog to digital converter coupled between the line driver and the transmitter SERDES isolator.

38. The network device according to claim 29 further comprising:
the Ethernet physical layer (PHY) with internal isolation comprising:
a communication channel across a capacitive isolation channel of the isolation and protection barrier comprising:
receiver and transmitter serializer/deserializer (SERDES) isolators internal to the Ethernet PHY and coupled across the capacitive isolation channel and operative to communicate data across the capacitive isolation barrier.

39. The network device according to claim 29 further comprising:
the Ethernet physical layer (PHY) with internal isolation comprising:
a communication channel across a capacitive isolation channel of the isolation and protection barrier comprising:
a clock and receiver isolator and a phase-locked loop (PLL) and transmitter isolator internal to the Ethernet PHY and coupled across the capacitive isolation channel and operative to transfer clock signals across the capacitive isolation barrier.

40. The network device according to claim 29 further comprising:
the Ethernet physical layer (PHY) with internal isolation comprising:
a communication channel across a capacitive isolation channel of the isolation and protection barrier comprising:
a capacitive isolation barrier internal to the Ethernet PHY;
a receiver and transmitter serializer/deserializer (SERDES) isolator internal to the Ethernet PHY and coupled to a secondary side of the capacitive isolation channel; and
a receiver and transmitter SERDES and Serial Gigabit Media Independent Interface (SGMII) isolator internal to the Ethernet PHY and coupled to a primary side of the capacitive isolation channel and operative to communicate data across the capacitive isolation barrier.

41. The network device according to claim 29 further comprising:
the Ethernet physical layer (PHY) configured as a non-Power-over-Ethernet (non-PoE) device.

42. A network device comprising:
an Ethernet physical layer (PHY) with internal isolation comprising:
an isolation and protection barrier operative for isolated power and signal transfer;
a primary circuit and a secondary circuit that communicate across the isolation and protection barrier;
the isolation and protection barrier comprising a power transfer isolation barrier and a data communication isolation barrier;
the primary circuit comprising a power extraction circuit that receives power from a power source, a Direct Current (DC)-DC converter primary circuit coupled to the power extraction circuit, and a primary communication interface coupled to a communication channel for communicating data; and
the secondary circuit comprising a DC-DC converter secondary circuit configured to receive power transferred from the DC-DC converter primary circuit through the power transfer isolation barrier, and a feedback circuit coupled to a secondary communication interface and configured to receive feedback control data passed through the data communication isolation barrier and control power transfer according to the feedback control data.

43. The network device according to claim 42 further comprising:
the secondary circuit further comprising an application power interface coupled to the DC-DC converter secondary circuit configured to supply power to an application, a secondary communication interface configured to communicate data with the primary communication interface through the data communication isolation barrier.

44. The network device according to claim 42 further comprising:
the application comprising a Power-over-Ethernet application.

45. The network device according to claim 42 further comprising:
the power transfer isolation barrier comprising a transformer;
the data communication isolation barrier comprising a capacitive isolation barrier;
the power extraction circuit coupled to an Alternating Current (AC)/Direct Current (DC) converter coupled a wall jack;
the primary communication interface comprising a transmitter and receiver circuit and a serializer-deserializer (SERDES) coupled between the transmitter and receiver circuit and the capacitive isolation barrier; and
the secondary communication interface comprising an isolated device control circuit and a serializer-deserializer (SERDES) coupled between the isolated device control circuit and the capacitive isolation barrier.

46. The network device according to claim 45 further comprising:
a transformer connect (Tconnect) and powered device (PD) control circuit coupled to the Direct Current (DC)-DC converter primary circuit and the communication channel.

47. The network device according to claim 45 further comprising:
a Direct Current (DC)-DC power extraction winding coupled to the power extraction circuit.

48. A network device comprising:
a Power-over-Ethernet (PoE) Power Sourcing Equipment (PSE) Ethernet physical layer (PHY) with isolation comprising:
an isolation and protection barrier operative for isolated power and signal transfer;
a PSE controller;
a PSE feed coupled to and controlled by the PSE controller;
an autotransformer operative to feed sourced power to an application; and
control isolators coupled across a capacitive channel of the isolation and protection barrier that communicate data across the capacitive channel including a feedback signal to control power transfer across a transformer.

49. The network device according to claim 48 wherein:
the autotransformer comprises at least one pair of discrete inductors.

50. The network device according to claim 48 further comprising:
the Ethernet physical layer (PHY) with internal isolation comprising:
communication isolators that communicate data across a capacitive channel of the isolation and protection barrier.

51. The network device according to claim 48 further comprising:
the Ethernet physical layer (PHY) with internal isolation comprising:

clock isolators that communicate clock signals across a capacitive channel of the isolation and protection barrier.

52. The network device according to claim 48 further comprising:
the Ethernet physical layer (PHY) with internal isolation comprising:
a communication channel across a capacitive isolation channel of the isolation and protection barrier.

53. The network device according to claim 48 further comprising:
the Ethernet physical layer (PHY) with internal isolation comprising:
a communication channel across a capacitive isolation channel of the isolation and protection barrier comprising at least one active termination, electromagnetic interference (EMI) filtering, voltage mode, droop compensation line driver internal to the Ethernet PHY and coupled directly to a line.

54. The network device according to claim 48 further comprising:
the Ethernet physical layer (PHY) with internal isolation comprising:
a communication channel across a capacitive isolation channel of the isolation and protection barrier comprising at least line driver comprising at least one functionality selected from a group consisting of active termination, non-active termination, electromagnetic interference (EMI) filtering, non-EMI filtering, voltage mode, current mode, droop compensation, and non-droop compensation.

55. The network device according to claim 48 further comprising:
the Ethernet physical layer (PHY) with internal isolation comprising:
a communication channel across a capacitive isolation channel of the isolation and protection barrier comprising at least one surge protection and electromagnetic interference (EMI) filter coupled directly to a line.

56. The network device according to claim 48 further comprising:
the Ethernet physical layer (PHY) with internal isolation comprising:
a communication channel across a capacitive isolation channel of the isolation and protection barrier comprising:
a transmitter channel and a receiver channel coupling receiver and transmitter serializer/deserializer (SERDES) isolators directly to a line; and
the transmitter channel comprising:
an active termination, electromagnetic interference (EMI), voltage mode line driver coupled directly to the line; and a transmitter digital to analog converter coupled between the line driver and the transmitter SERDES isolator; and
the receiver channel comprising:
a hybrid and analog echo canceller coupled directly to the line; and
a receiver analog to digital converter coupled between the line driver and the transmitter SERDES isolator.

57. The network device according to claim 48 further comprising:
the Ethernet physical layer (PHY) with internal isolation comprising:
a communication channel across a capacitive isolation channel of the isolation and protection barrier comprising:
receiver and transmitter serializer/deserializer (SERDES) isolators internal to the Ethernet PHY and coupled across the capacitive isolation channel and operative to communicate data across the capacitive isolation barrier.

58. The network device according to claim 48 further comprising:
the Ethernet physical layer (PHY) with internal isolation comprising:
a communication channel across a capacitive isolation channel of the isolation and protection barrier comprising:
a clock receiver isolator and a phase-locked loop (PLL) transmitter isolator internal to the Ethernet PHY and coupled across the capacitive isolation channel and operative to transfer clock signals across the capacitive isolation barrier.

59. A network device comprising:
an Ethernet physical layer (PHY) directly connectable to a network line comprising an internal isolation, protection, and electromagnetic interference suppression barrier operative for isolated power and data transfer.

* * * * *